(12) United States Patent
Choi

(10) Patent No.: US 12,101,964 B2
(45) Date of Patent: Sep. 24, 2024

(54) ELECTROLUMINESCENCE DISPLAY APPARATUS

(71) Applicant: LG Display Co., Ltd., Seoul (KR)

(72) Inventor: Howon Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 391 days.

(21) Appl. No.: 17/541,986

(22) Filed: Dec. 3, 2021

(65) Prior Publication Data

US 2022/0181396 A1  Jun. 9, 2022

(30) Foreign Application Priority Data

Dec. 9, 2020  (KR) .................. 10-2020-0171531

(51) Int. Cl.
| | |
|---|---|
| *H10K 59/121* | (2023.01) |
| *H10K 59/122* | (2023.01) |
| *H10K 59/124* | (2023.01) |
| *H10K 71/00* | (2023.01) |
| *H10K 59/12* | (2023.01) |

(52) U.S. Cl.
CPC ......... *H10K 59/121* (2023.02); *H10K 59/122* (2023.02); *H10K 59/124* (2023.02); *H10K 71/00* (2023.02); *H10K 59/1201* (2023.02)

(58) Field of Classification Search
CPC .. H10K 59/121; H10K 59/122; H10K 59/124; H10K 59/1201; H10K 71/00
See application file for complete search history.

(56) References Cited

U.S. PATENT DOCUMENTS

| | | | |
|---|---|---|---|
| 10,516,004 B2 | 12/2019 | Park et al. | |
| 2017/0186831 A1* | 6/2017 | Nam ................... | H10K 50/814 |
| 2018/0122882 A1* | 5/2018 | Lee ..................... | H10K 59/131 |
| 2018/0190731 A1 | 7/2018 | Park et al. | |
| 2021/0273026 A1 | 9/2021 | Seo et al. | |

FOREIGN PATENT DOCUMENTS

| | | |
|---|---|---|
| KR | 10-2018-0079059 A | 7/2018 |
| KR | 10-2020-0014462 A | 2/2020 |

\* cited by examiner

*Primary Examiner* — Timor Karimy

(74) *Attorney, Agent, or Firm* — Fenwick & West LLP

(57) ABSTRACT

A display apparatus includes a substrate including an emission area and a non-emission area surrounding the emission area, a planarization layer formed on the substrate, a light emitting device disposed on the planarization layer, and including an anode electrode, and a separation layer disposed to be spaced apart from the anode electrode on the planarization layer, wherein the planarization layer is formed to overlap at least a portion of the non-emission area and includes a trench portion formed by removing at least a portion of the planarization layer, the trench portion at least partially overlaps an end of each of the anode electrode and the separation layer in the non-emission area, the light emitting device further including a light emitting layer and a cathode electrode sequentially formed on the anode electrode, and the light emitting layer and the cathode electrode are discontinuously formed in the trench portion.

23 Claims, 20 Drawing Sheets

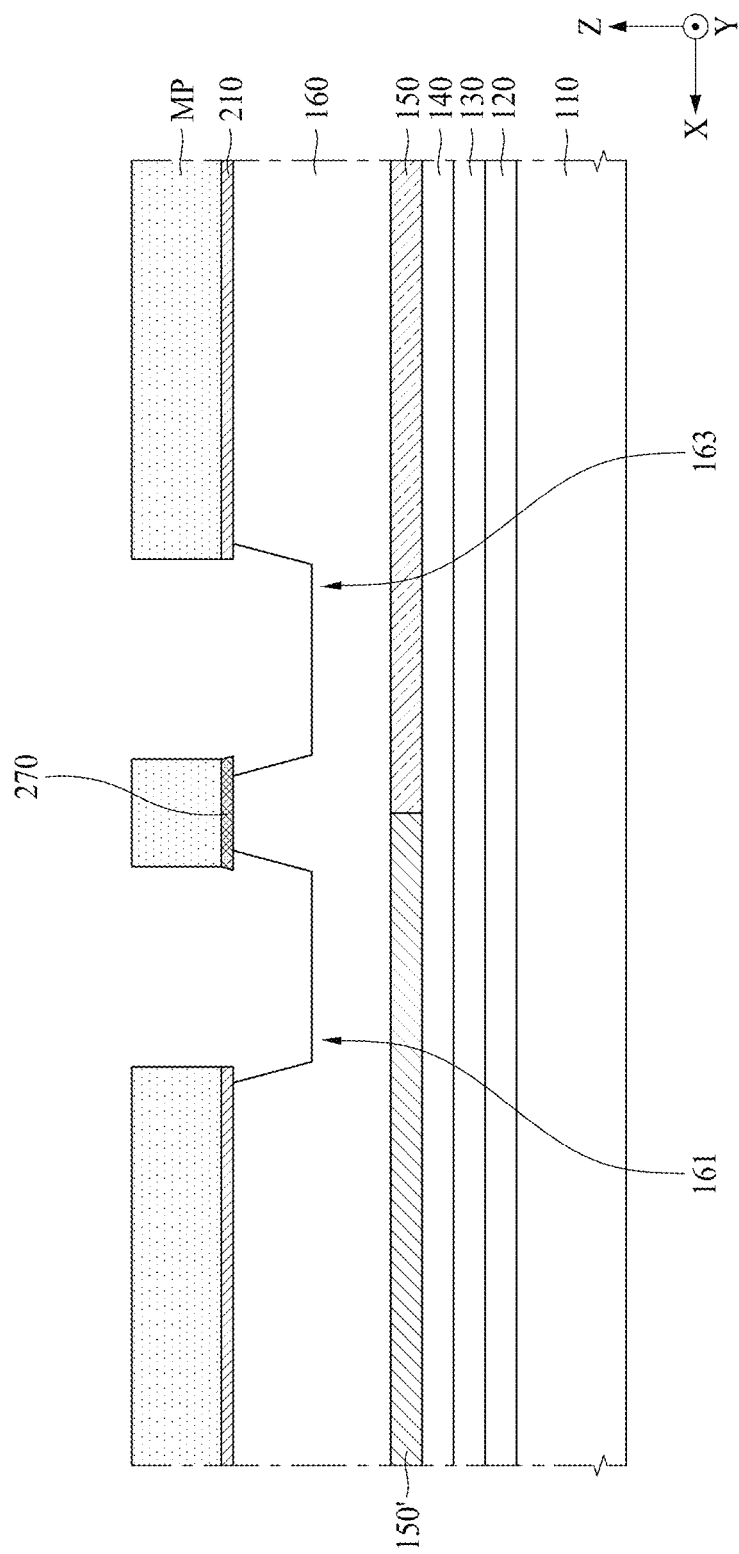

ELECTROLUMINESCENCE DISPLAY APPARATUS

CROSS-REFERENCE TO RELATED APPLICATIONS

This application claims the benefit of Republic of Korea Patent Application No. 10-2020-0171531 filed on Dec. 9, 2020, which is hereby incorporated by reference as if fully set forth herein.

BACKGROUND

Field

The present disclosure relates to an electroluminescence display apparatus, and more particularly, to an electroluminescence display apparatus having reduced lateral leakage current and improved aperture ratio.

Discussion of the Related Art

As the information society develops, demand for display apparatuses for displaying images has increased in various forms, and in recent years, various display apparatuses such as a liquid crystal display (LCD), a plasma display, and an organic light emitting display (OLED) have been used.

An electroluminescence display apparatus includes an array device and a light emitting device. The array device includes a switching thin film transistor (TFT) connected to gate and data lines and at least one driving thin film transistor (TFT) connected to the light emitting device, and the light emitting device includes a pixel electrode connected to the driving thin film transistor (TFT), a light emitting layer, and a cathode electrode.

However, in the electroluminescence display apparatus having the configuration described above, the pixel structure is integrated according to the development of technology, which may cause a problem in that a lateral leakage current occurs between adjacent emission areas, and in order to reduce such lateral leakage current, a structure that separates a required distance between the emission areas may be applied to cause a problem in that an aperture ratio is reduced.

SUMMARY

Accordingly, the present disclosure is directed to providing an electroluminescence display apparatus that substantially obviates one or more problems due to limitations and disadvantages of the related art.

An aspect of the present disclosure is directed to providing an electroluminescence display apparatus adopting a structure capable of improving reliability by reducing a lateral leakage current that may occur between adjacent emission areas.

Another aspect of the present disclosure is directed to providing an electroluminescence display apparatus structure capable of improving an aperture ratio by applying a structure for reducing a lateral leakage current.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an electroluminescence display apparatus including a substrate including an emission area and a non-emission area surrounding the emission area, a planarization layer formed on the substrate, a light emitting device disposed on the planarization layer, overlapping the emission area, and including an anode electrode, and a separation layer disposed to be spaced apart from the anode electrode on the planarization layer and disposed to be parallel to a first direction or a second direction in at least a portion of the non-emission area between one emission area and another emission area adjacent to the one emission area, wherein the planarization layer is formed to overlap at least a portion of the non-emission area and includes a trench portion formed by removing at least a portion of the planarization layer, the trench portion at least partially overlaps an end of each of the anode electrode and the separation layer in the non-emission area, the light emitting device further includes a light emitting layer and a cathode electrode sequentially formed on the anode electrode, and the light emitting layer and the cathode electrode are discontinuously formed in the trench portion.

In another embodiment, a display apparatus includes a substrate including a plurality of emission areas of a plurality of subpixels, the plurality of emission areas including a first emission area of a first subpixel and a second emission area of a second subpixel with a non-emission area disposed therebetween, a planarization layer on the substrate, the planarization layer having a first trench adjacent to the first emission area and a second trench adjacent to the second emission area, at least a part of the planarization layer disposed between the first trench and the second trench, a first light emitting device disposed on a first upper surface of the planarization layer in at least the first emission area and a second light emitting device disposed on a second upper surface of the planarization layer in at least the second emission area, and at least one separation layer disposed on the part of the planarization layer, wherein at least one end of the separation layer protrudes beyond a side surface of the part of the planarization layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

FIGS. 14A to 14F are views illustrating a method of manufacturing an electroluminescence display apparatus according to an embodiment the present disclosure.

DETAILED DESCRIPTION

Figure 1:
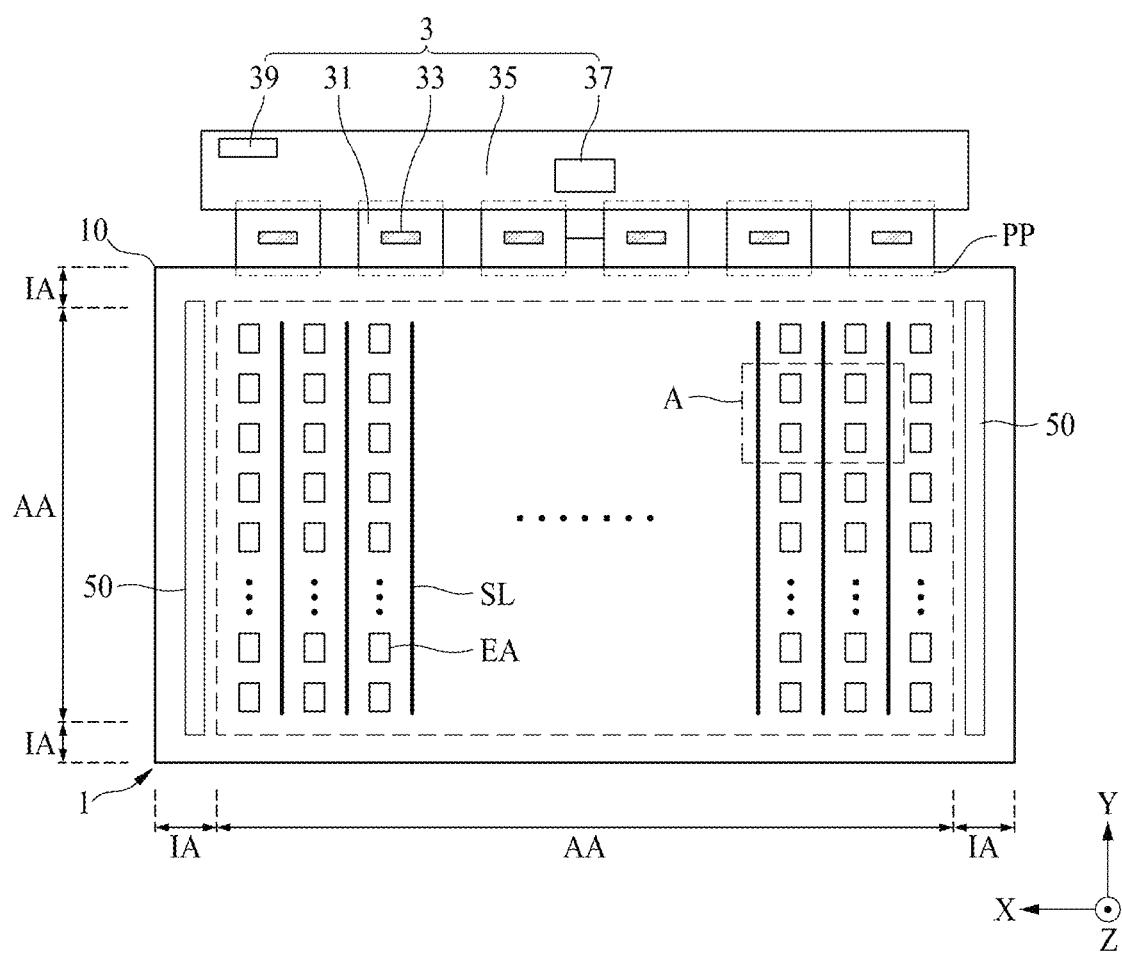
FIG. 1 is a plan view of an electroluminescence display apparatus according to an embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present disclosure are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it may be directly on or directly connected to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art may sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 2:
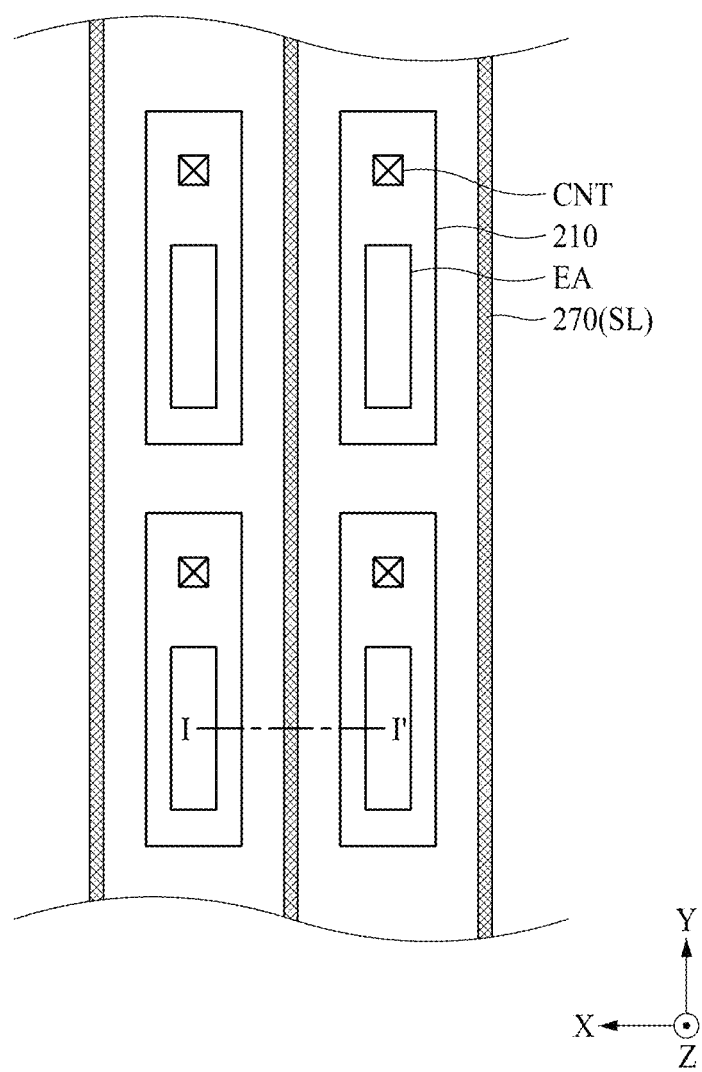
FIG. 2 is a plan view illustrating region A of FIG. 1 according to an embodiment of the present disclosure.
Figure 3:
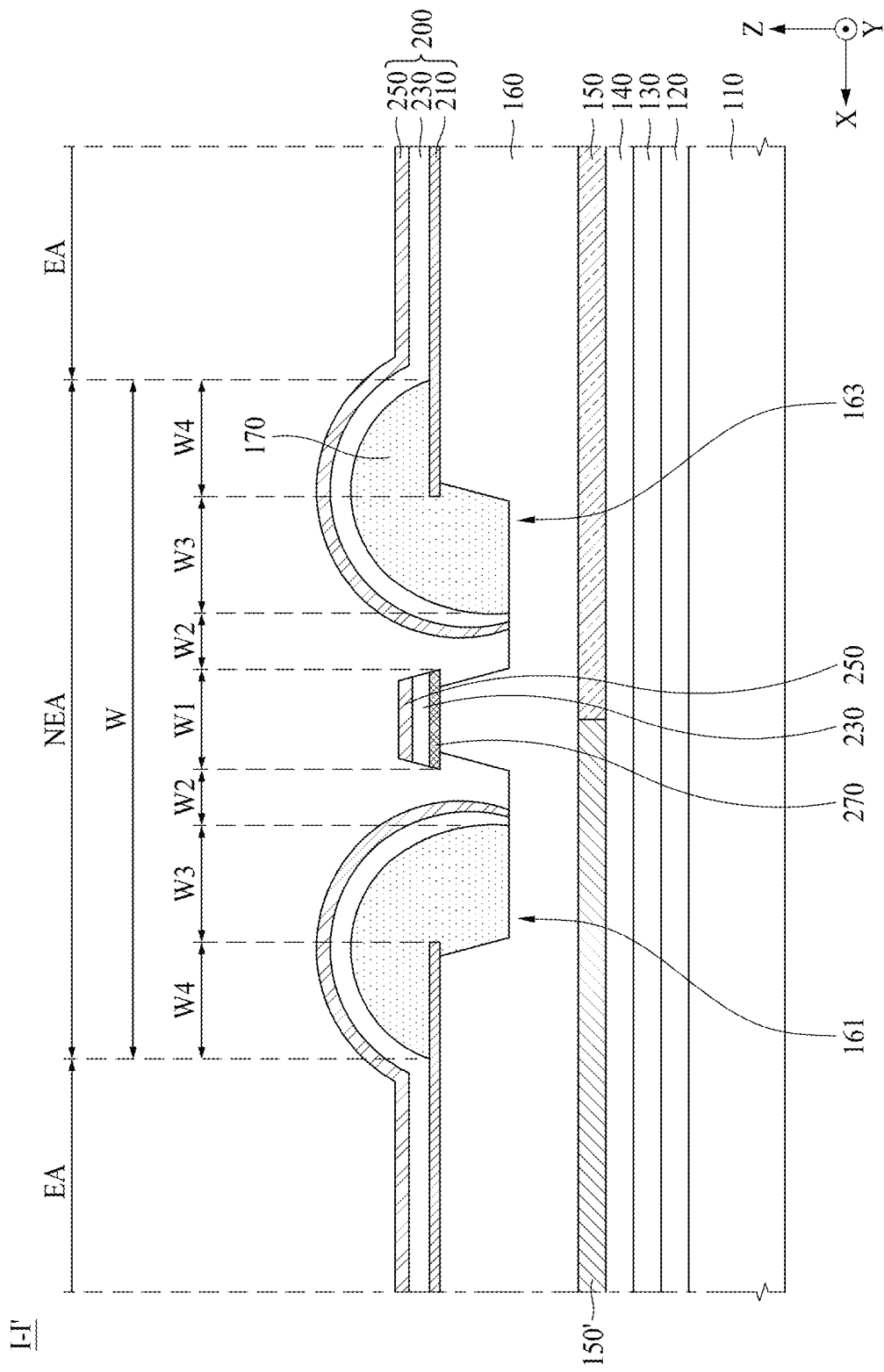
FIG. 3 is a cross-sectional view taken along line I-I' of FIG. 2 according to an embodiment of the present disclosure.

FIG. 1 is a plan view of an electroluminescence display apparatus according to an embodiment of the present disclosure, FIG. 2 is a plan view of "A" of FIG. 1, and FIG. 3 is a cross-sectional view taken along line I-I' of FIG. 2.

Referring to FIG. 1, an electroluminescence display apparatus according to an embodiment of the present disclosure may include a display panel 1 and a panel driving circuit unit 3.

The display panel 1 may include a substrate 10, an active area AA, an inactive area IA, and a gate driving circuit 50.

The substrate 10 may be a glass substrate, a bendable thin glass substrate, a plastic substrate, or a silicon wafer substrate.

The active area AA is an area in which an image is displayed, and may also be expressed as a first area, a display portion, a display area, or an active portion. For example, the active area AA may be disposed in a portion other than an edge portion of the substrate 10.

The inactive area IA is an area in which an image is not displayed, and may also be expressed as a second area, a non-display portion, a non-display area, or an inactive portion. For example, the non-display portion may be disposed at an edge portion of the substrate 10 to surround the active area AA.

The active area AA may include a plurality of emission areas EA of a plurality of subpixels and a non-emission area NEA surrounding the plurality of emission areas EA.

A light emitting device 200 including an anode electrode 210 may be disposed in the emission area EA. Here, the emission area EA may be defined as an area in which the anode electrode 210 exposed by the bank 170 to be described later is formed. In addition, in FIG. 2, a subpixel structure including the emission areas EA classified as region A may be configured as a rectangular stripe structure in which a length of one side is relatively long, and a region including four emission areas EA like region A may be defined as one unit pixel. When a rectangular unit pixel is divided into quadrants, one subpixel or an emission area may be formed in each quadrant. However, the pixel structure of the electroluminescence display apparatus according to the present disclosure is not limited thereto, and various well-known structures such as a quad type, a diamond type, and a pentile type may be applied.

In FIG. 2, a subpixel including an emission area EA on the upper left may be a white subpixel, a subpixel including an emission area EA on the upper right may be a red subpixel, a subpixel including an emission area EA on the lower left may be a green subpixel, and a subpixel including an emission area EA on the lower right may be a blue subpixel. However, the arrangement structure of the emission areas EA or the subpixels according to the present disclosure is not limited thereto.

Accordingly, the anode electrode 210 may be formed to overlap the emission area EA and extend to at least a portion of the non-emission area NEA surrounding the emission area EA. A contact hole CNT for contacting a driving thin film transistor (TFT) may be provided on at least one side of the anode electrode 210. Also, the bank 170 may be formed to overlap the anode electrode 210 extending to at least a portion of the emission area EA, while overlapping the non-emission area NEA.

Here, the non-emission area NEA may be defined as a region other than the emission area EA. In addition, the non-emission area NEA may include the contact hole CNT for contacting a driving thin film transistor (TFT) and the anode electrode 210 of the light emitting device 200. Interconnections and circuits for driving the light emitting device 200 of the emission area EA may be disposed in the non-emission area NEA.

As shown in FIG. 3, a cathode electrode 250 may be formed to overlap the entire active area AA, excluding a partial region overlapping the trench portions 161 and 163 of the planarization layer 160 disposed in the non-emission area NEA of the active area AA.

Referring to FIG. 1, the gate driving circuit 50 supplies gate signals to the gate lines according to a gate control signal provided from the driving circuit unit 3 through a plurality of gate pads of the pad portion PP and a link line. For example, the gate driving circuit 50 may be disposed in at least one of the inactive areas IA on both sides of the substrate 10 facing each other. The gate driving circuit 50 may be formed in a non-display area on one side or both sides of the display area of the display panel 1 by a gate driver in panel (GIP) method. Alternatively, the gate driver may be manufactured as a driving chip, mounted on a flexible layer, and attached to a non-display area outside one or both sides of the active area of the display panel 1 by a tape automated bonding (TAB) method.

The driving circuit unit 3 according to an example may include a plurality of flexible circuit films 31, a plurality of data driving integrated circuits (IC) 33, a printed circuit board (PCB) 35, a timing controller 37, and a power circuit unit 39.

Each of the plurality of flexible circuit films 31 may be attached to the pad portion PP and the printed circuit board (PCB) 35 provided on the substrate 10. For example, one side (or output bonding portion) of each of the plurality of flexible circuit films 31 may be attached to the pad portion PP provided on the substrate 10 by a film attaching process using an anisotropic conductive layer. The other side (or input bonding portion) of each of the plurality of flexible circuit films 31 may be attached to the printed circuit board (PCB) 35 by a film attaching process using an anisotropic conductive layer.

The plurality of data driving integrated circuits (IC) 33 is individually mounted on the plurality of flexible circuit films 31, respectively. Each of the plurality of data driving integrated circuits (IC) 33 may receive pixel data and a data control signal provided from the timing controller 37, convert the pixel data into an analog data voltage for each pixel according to the data control signal, and supply the data voltage to a corresponding data line.

The printed circuit board (PCB) 35 may be connected to the other side of each of the plurality of flexible circuit films 31. The printed circuit board (PCB) 35 may serve to transfer signals and voltages between components of the driving circuit unit 3.

The timing controller 37 may be mounted on the printed circuit board (PCB) 35 and receive image data and a timing synchronizing signal provided from the display driving system through a user connector disposed on the printed circuit board (PCB) 35.

The timing controller 37 may generate pixel data by aligning the image data to fit a pixel arrangement structure disposed in the active area AA based on the timing synchronizing signal, and provide the generated pixel data to each of a plurality of data driving integrated circuits (IC) 33.

The timing controller 37 may generate a data control signal and a gate control signal based on the timing synchronizing signal. Also, the timing controller 37 may control a driving timing of each of the plurality of data driving integrated circuits (IC) 33 through the data control signal and may control a driving timing of the gate driving circuit 50 through the gate control signal. For example, the timing synchronizing signal may include a vertical synchronizing signal, a horizontal synchronizing signal, a data enable signal, and a main clock (or dot clock).

The power circuit unit 39 may be mounted on the printed circuit board (PCB) 35. In addition, the power circuit unit 39 may generate various power voltages necessary for displaying an image on a pixel using input power supplied from the outside, and may provide the generated voltages to a corresponding circuit.

Referring to FIG. 3, the electroluminescence display apparatus according to an example of the present disclosure may include a color filter 150, a planarization layer 160, a light emitting device 200, a bank 170, and a separation layer 270 formed on a substrate 110.

Here, the substrate 110 may have the same configuration as the substrate 10 described above with reference to FIG. 1.

Accordingly, the substrate 110 may be a glass substrate, a bendable and flexible thin glass substrate, a plastic substrate, or a silicon substrate.

The buffer layer 120 may be disposed on the substrate 110 and the light blocking layer LS. According to an example, the buffer layer 120 may be formed by stacking a plurality of inorganic layers. For example, the buffer layer 120 may be formed as a multilayer in which one or more inorganic layers of a silicon oxide (SiOx), a silicon nitride (SiN), and a silicon oxynitride (SiON) are stacked.

A circuit device including a thin film transistor (TFT) or the like may be disposed on the buffer layer 120. Here, the circuit device may include a switching thin film transistor (TFT), a sensing thin film transistor (TFT), and a driving thin film transistor (TFT). In this case, the driving thin film transistor (TFT) may be in contact with the anode electrode 210 of the light emitting device 200 through the contact hole CNT of FIG. 2. Here, the buffer layer 120 may be omitted depending on a configuration of the electroluminescence display apparatus of the present disclosure.

The interlayer insulating layer 130 may be configured to electrically insulate the aforementioned thin film transistors (TFT), interconnections or circuits. The interlayer insulating layer 130 may be formed on the buffer layer 120. The interlayer insulating layer 130 may include a silicon oxide layer ($SiO_2$) or silicon nitride (SiN) or may include a plurality of layers including a silicon oxide layer ($SiO_2$) and silicon nitride (SiN).

The protective layer 140 may be provided on the interlayer insulating layer 130. The protective layer 140 may function to protect the electrodes of the thin film transistor (TFT). The protective layer 140 may include the aforementioned contact hole CNT in contact with the thin film transistor (TFT). According to an example, the protective layer 140 may include a silicon oxide layer ($SiO_2$) or silicon nitride (SiN).

The color filters 150 and 150' may be provided on the protective layer 140. The electroluminescence display apparatus according to an example of the present disclosure may have a bottom emission structure in which the color filters 150 and 150' are positioned between the light emitting device 200 and the substrate 110. However, the scope of the present disclosure is not limited to the electroluminescence display apparatus having the bottom emission structure and may include both an electroluminescence display having a top emission structure or an electroluminescence display having a bidirectional emission structure. Hereinafter, for convenience of description, an electroluminescence display apparatus having a bottom emission structure will be described as a reference.

In this case, the color filter 150 overlapping one emission area EA and the color filter 150' overlapping the another emission area EA may be color filters that transmit light of different colors, respectively, and may be, for example, one of a red color filter, a green color filter, and a blue color filter. However, embodiments of the present disclosure are not limited thereto.

Also, the color filter 150 may be omitted when the emission area EA including the light emitting device 200 is a white emission area EA.

Accordingly, the color filter 150 may be disposed on the protective layer 140, may be disposed between the protective layer 140 and the planarization layer 160, and may change light output from the light emitting device 200 downward to a color having a range of a predetermined wavelength.

The planarization layer 160 may be disposed on the color filter 150. In addition, the planarization layer 160 may be disposed in the emission area EA of the active area AA so that the emission area EA defined by the light emitting device 200 and the bank 170 is substantially flat. Also, the planarization layer 160 may be disposed in the non-emission area NEA of the active area AA. However, in the non-emission area NEA, at least a portion of the planarization layer 160 may be removed. For example, in the non-emission area NEA, an upper surface of the planarization layer 160 may be partially removed to form a first trench portion 161 and a second trench portion 162. The first trench portion 161 and the second trench portion 162 may be disposed to be spaced apart from each other with a part of the planarization layer 160 between the first trench portion 161 and the second trench portion 162.

Referring to FIG. 3, the planarization layer 160 may include the first trench portion 161 and the second trench portion 163 formed by removing at least a portion of the planarization layer 160, while overlapping the non-emission area NEA. In addition, the first trench portion 161 may be disposed adjacent to one adjacent emission area EA, and the second trench portion 163 may be disposed adjacent to another emission area EA, and a part of the planarization layer 160 may remain between the first trench portion 161 and the second trench portion 163 after forming the trench portion.

Specifically, the first trench portion 161 may overlap one end of the separation layer 270 and may overlap one end of the anode electrode 210 of the one emission area EA. The second trench portion 163 may overlap the other end of the separation layer 270 and may overlap one end of the anode electrode 210 of the another emission area EA.

Here, the meaning that the first trench portion 161 and the second trench portion 163 overlap the anode electrode 210 and the separation layer 270 may be defined as follows. The first trench portion 161 and the second trench portion 163 may be formed in a recess-like shape by removing a portion of the upper surface of the planarization layer 160. Accordingly, the first trench portion 161 and the second trench portion 163 may each be formed to have both sides (for example, a first side surface and a second surface) and a bottom side. Therefore, the first trench portion 161 and the second trench portion 163 may be defined as regions in which both sides and bottom sides are formed. When at least a portion of both sides of the first trench portion 161 and the second trench portion 163 overlaps the anode electrode 210 and the separation layer 270, the first trench portion 161 and the second trench portion 163 may be defined as overlapping the anode electrode 210 and the separation layer 270.

The separation layer 270 may be formed in a structure that protrudes more than sidewalls of the trench portions 161 and 163. The separation layer 270 may be disposed on an upper surface of the part of the planarization layer 160 and may be disposed between the first trench portion 161 and the second trench portion 163. One side surface of the separation layer 270 disposed between the first trench portion 161 and the second trench portion 163 may protrude more than one sidewall of the first trench portion 161 that may correspond to one side surface of the part of the planarization layer 160, and the other side surface of the separation layer 270 may be formed to protrude more than one sidewall of the second trench portion 163 that may correspond to one side surface of the part of the planarization layer 160. Thus, one side surface of the separation layer 270 may protrude beyond the one sidewall of the first trench portion 161 to expose a portion of a bottom surface of the separation layer 270, and another side surface of the separation layer 270 may protrude beyond the one sidewall of the second trench portion 163 to expose another portion of a bottom surface of the separation layer 270. Here, one sidewall of the first trench portion 161 and one sidewall of the second trench portion 163 may be disposed to face each other. Through this structure, the light emitting layer 230 and the cathode electrode 250 of the light emitting device 200 described above may be provided in a discontinuous structure with the separation layer 270 as a boundary.

The first trench portion 161 and the second trench portion 163 formed in the planarization layer 160 may be formed to be further inward from the ends of the separation layer 270 and the anode electrode 210, respectively. This may be formed by setting an etch rate of the planarization layer 160 located under the separation layer 270 and the anode electrode 210 to be higher in an etching process of removing the planarization layer 160. As the etching process, a dry etching process or a wet etching process may be used, and any known etching process may be used without limitation.

The planarization layer 160 may be formed of an organic layer such as acrylic resin, epoxy resin, phenolic resin, polyamide resin, polyimide resin.

The light emitting device 200 may be disposed on the planarization layer 160 and may be electrically connected to the driving thin film transistor (TFT) T. The anode electrode 210 of the light emitting device 200 may contact the source electrode SE of the driving thin film transistor (TFT) T through a contact hole formed in at least a portion of the planarization layer 160 and the protective layer 140.

According to an example of the present disclosure, the light emitting device 200 may be formed on the planarization layer 160. The light emitting device 200 may include the anode electrode 210 formed to overlap the emission area EA on the substrate 110, the cathode electrode 250 formed to face the anode electrode 210 and overlap the entire active area AA, and the light emitting layer 230 formed between the anode electrode 210 and formed to correspond to the cathode electrode 250. For example, in FIG. 3, the display apparatus may include a first light emitting device 200 including a first anode electrode, a portion of the light emitting layer 230, and a portion of the cathode electrode 250, and a second light emitting device 200 including a second anode electrode, another portion of the light emitting layer 230, and another portion of the cathode electrode 250. The first light emitting device 200 may be disposed on a first upper surface of the planarization layer 160 and the second light emitting device 200 may be disposed on a second upper surface of the planarization layer 160.

The anode electrode 210 may be disposed on the planarization layer 160. Specifically, in FIG. 3, a first anode electrode may protrude beyond another sidewall of the first trench portion 161 to expose a bottom surface of the first anode electrode. A second anode electrode may protrude beyond another sidewall of the second trench portion 163 to expose a bottom surface of the second anode electrode. The anode electrode 210 may contact a source electrode of the driving thin film transistor (TFT) through the contact hole CNT provided in the planarization layer 160. For example, the anode electrode 210 may include a plurality of layers of anode electrodes disposed on the planarization layer 160.

When the electroluminescence display apparatus according to an example of the present disclosure has a bottom emission structure as described above, the anode electrode 210 may be a transmissive electrode. For example, the anode electrode 210 may include a transparent conductive oxide such as indium tin oxide (ITO) and indium zinc oxide (IZO).

The light emitting layer 230 may be disposed to overlap the plurality of emission areas EA and may be disposed to cover the bank 170 of the non-emission area NEA. Specifically, the light emitting layer 230 may be disposed to overlap at least partially with the trench portions 161 and 163 formed in the non-emission area NEA.

According to another embodiment of the present disclosure, the light emitting layer 230 may be formed through deposition fixing to correspond to each subpixel area using a predetermined mask pattern, and when formed in this way, the light emitting layer 230 may be formed so as not to overlap the non-emission area NEA. In this disclosure, the light emitting layer 230 will be described on the basis that it is formed without a separate mask pattern in the active area AA.

According to an example, the light emitting layer 230 may include a hole transporting layer, a color light emitting layer, and an electron transporting layer. In this case, when a voltage is applied to the anode electrode 210 and the cathode electrode 250, holes and electrons move to the color light emitting layer through the hole transporting layer and the electron transporting layer, respectively, and are combined with each other in the color light emitting layer to emit light. According to an example, the light emitting layer 230 may further include at least one functional layer for improving light emitting efficiency and lifespan of the light emitting layer 230.

The cathode electrode 250 may be provided on the light emitting layer 230, and the cathode electrode 250 may be implemented in the form of an electrode common to the active area AA. In FIG. 3, the cathode electrode 250 is shown to be physically disconnected from the predetermined non-emission area NEA in which the separation layer 270 is formed, but it may be provided in a structure of a connected common electrode.

Accordingly, the cathode electrode 250 may be a common layer formed in common in the subpixel regions to apply the same voltage. When the electroluminescence display apparatus according to an example of the present disclosure is a bottom emission type, the cathode electrode 250 may include a semi-transmissive conductive material such as titanium (Ti), aluminum (Al), molybdenum (Mo), magnesium (Mg), silver (Ag), or a magnesium-silver alloy (MgAg). When the cathode electrode 250 is configured as a transflective electrode, the cathode electrode 250 may be formed with a thickness of several tens of nm for transflective properties. In addition, the cathode electrode 250 may be configured as a reflective electrode and may be configured as a multilayer structure such as a stacked structure (Ti/Al/Ti) of aluminum (Al) and titanium (Ti), a stacked structure (ITO/Al/ITO) of aluminum (Al) and ITO, or a stacked structure (ITO/APC/ITO) of an Ag/Pd/Cu (APC) alloy and ITO, or may be formed as a single layer or a multilayer structure including any one material selected from among silver (Ag), aluminum (Al), molybdenum (Mo), gold (Au), magnesium (Mg), calcium (Ca) or barium (Ba) or two or more alloy materials, but is not limited.

In addition, a structure such as a reflective plate may be added to an upper portion of the cathode electrode 250 according to the requirements of the electroluminescence display apparatus, such as luminous efficiency or luminance of the light emitting device 200.

The separation layer 270 may be disposed to at least partially overlap the non-display region NEA and be spaced apart from the anode electrode 210 on the planarization layer 160. Also, the separation layer 270 may be disposed between two adjacent emission areas EA. Since the light emitting layer 230 is formed in a discontinuous structure by the separation layer 270, a lateral leakage current that may occur between two adjacent emission areas EA may be reduced. As illustrated in FIG. 1, the separation layer 270 is disposed to overlap the active area AA, but may not extend to an outer edge of the active area AA. For example, in FIG. 3, another portion of the light emitting layer 230 may be disposed on the part of the planarization layer 160, and the another portion of the light emitting layer 230 is physically disconnected from the portion of the light emitting layer 230 of the first light emitting device or the second light emitting device. In addition, another portion of the cathode electrode 250 may be disposed on the part of the planarization layer 160, and the another portion of the cathode electrode 250 is physically disconnected from the portion of the cathode electrode 250 of the first light emitting device or the second light emitting device.

A plurality of separation layers 270 may be provided to have a size corresponding to the emission area EA, and the separation layer 270 is positioned only between the emission areas EA based on the emission regions EA of a first row of the active area AA in the first direction X. Thus, when number N emission areas EA of the first row in the first direction X are provided, number N–1 separation layers 270 may be formed because the separation layer 270 is positioned only between the number N emission regions EA of the first row.

A lateral leakage current that may occur between the adjacent emission areas EA may increase in inverse proportion to a distance between the two emission areas EA. Accordingly, in the pixel structure including the emission areas EA shown in FIG. 2, a lateral leakage current component in the first direction X may be the most dominant, and a lateral leakage current component in the second direction Y may be second dominant. At this time, since the lateral leakage current occurring between one emission area EA and another emission area EA positioned diagonally therefrom is located at a relatively long distance, it contributes very little to a total lateral leakage current, so it may be neglected.

Figure 11:
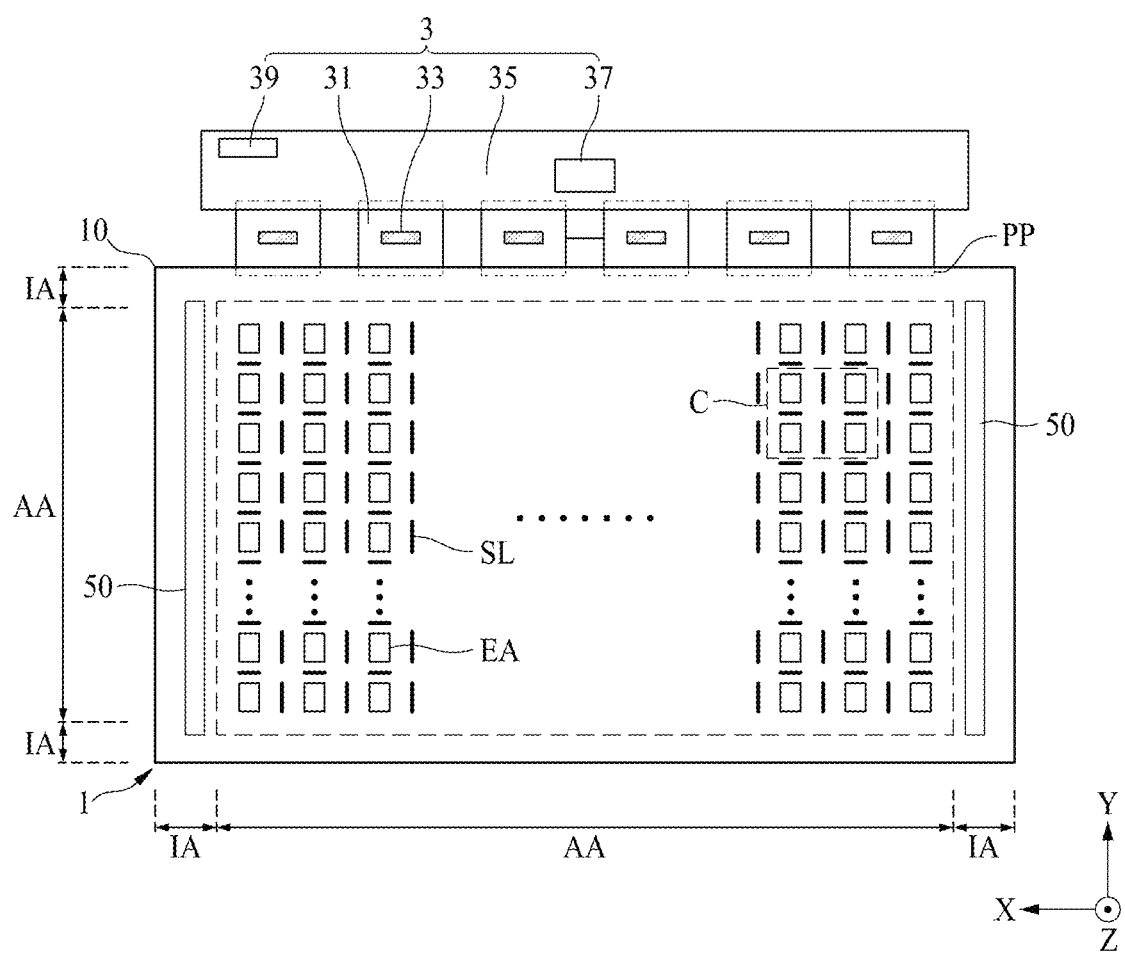
FIG. 11 is a plan view of an electroluminescence display apparatus according to another embodiment of the present disclosure.
Figure 12:
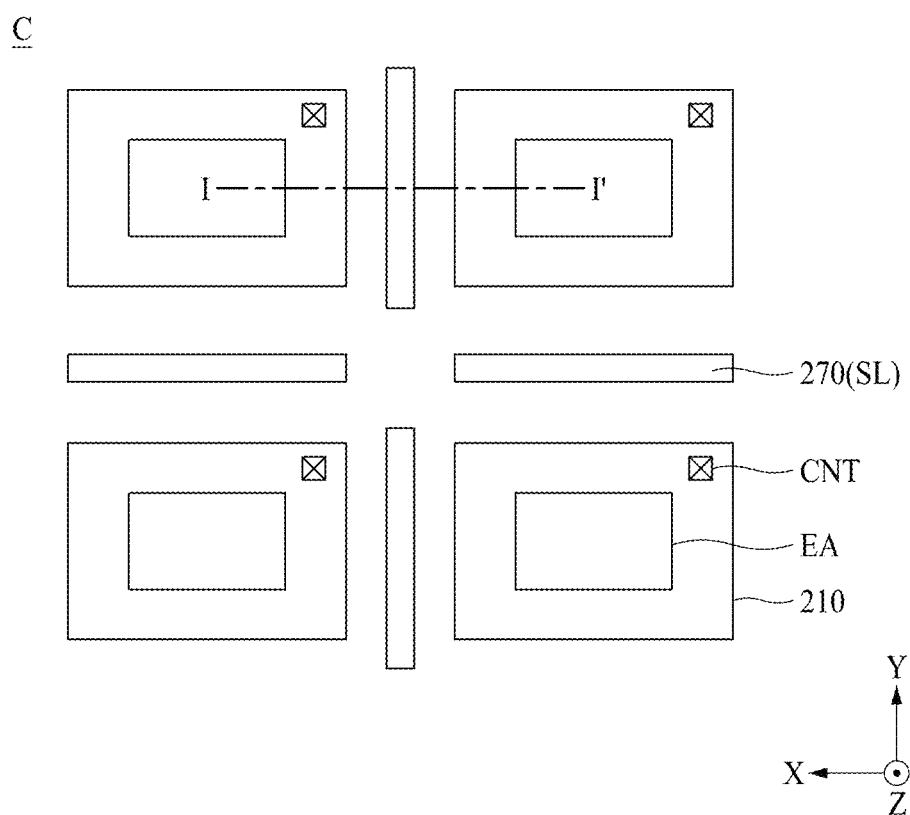
FIG. 12 is a plan view illustrating region C of FIG. 11 according to an embodiment of the present disclosure.

In FIGS. 1 and 2, the separation layer 270 disposed between the adjacent emission areas EA is configured to extend in the second direction Y and to be arranged parallel to the second direction Y, but is not limited thereto. As shown in FIGS. 11 and 12, which will be described later, the separation layer 270 may extend in the first direction X, may be arranged to be parallel to the first direction X, and may be configured to be disposed between adjacent emission areas EA within the scope of the present disclosure.

The separation layer SL may be disposed to be spaced apart from the anode electrode 210 on the planarization layer 160 to be described later. In addition, the separation layer SL may be disposed in at least a portion of the non-emission area NEA disposed between the emission area EA and another emission area EA adjacent to the emission area EA may be disposed parallel to the first direction X or the second direction Y.

The separation layer SL may include a material different from that of the anode electrode 210.

Specifically, as the separation layer SL, an inorganic layer including a material different from that of the anode electrode 210 may be used, when the anode electrode 210 is formed of a transparent electrode including a transparent conductive oxide. For example, the separation layer SL may be an oxide or nitride-based inorganic layer. For example, the separation layer SL may include at least one of silicon oxide (SiOx), silicon nitride (SiN), and silicon oxynitride (SiON). However, the present invention is not limited thereto, and the separation layer SL may be formed of a multilayer including at least two of a silicon oxide layer (SiOx), a silicon nitride (SiN), and a silicon oxynitride (SiON).

When the separation layer SL is formed of the same material as the anode electrode 210, an aperture ratio of the active area may be reduced due to a high patterning margin between the homogeneous materials.

When the separation layer SL is formed of a material different from that of the anode electrode 210, a minimum distance between the separation layer SL and the anode electrode 210 adjacent to each other may be set as a first distance. When the separation layer SL is formed of the same material as the anode electrode 210, the minimum distance between the separation layer SL and the anode electrode 210 adjacent to each other may be set to a second distance. When the separation layer SL is formed of the same material as the anode electrode 210, it is difficult to set the minimum spaced width to, for example, about 8 μm or less due to the patterning margin of the process. However, when the separation layer SL is formed of a material different from that of the anode electrode 210, the minimum spaced width of the separation layer SL and the anode electrode 210 may be set to, for example, about 3.5 μm. Accordingly, when the separation layer SL is formed of the same material as the anode electrode 210, and a structure for reducing leakage current occurring in the adjacent emission area EA is applied, a numerical value of the aperture ratio may be reduced.

Accordingly, the first distance may have a size that is 30 to 50% smaller than the second distance. Accordingly, the electroluminescence display apparatus according to an example of the present disclosure may have a structure in which the first distance is minimized Referring to FIG. 3, the first distance, which is the minimum distance between the separation layer SL and the anode electrode 210, may be the sum of a second width W2 and a third width W3. As such, when the separation layer SL is formed of a material different from that of the anode electrode 210, the width of the non-emission area NEA may be reduced, and thus the numerical value of the aperture ratio may be relatively improved.

Accordingly, in the electroluminescence display apparatus according to an example of the present disclosure, the distance between the separation layer SL and the adjacent anode electrode 210 may be reduced, and in other words, the width of the non-emission area NEA located between the adjacent emission areas EA may be reduced. Accordingly, the electroluminescence display apparatus according to an example of the present disclosure may have an improved numerical value of the aperture ratio compared to the structure of the related art.

Here, the aperture ratio may be defined as a ratio of the emission area EA to the active area AA. Alternatively, the aperture ratio may be defined as a ratio occupied by an opening defined by the bank 170 in the pixels constituting the active area AA.

The bank 170 may define the emission area EA of each of the subpixel regions and may be disposed in at least a portion of the non-emission area NEA adjacent to the emission area EA. At this time, the emission area EA indicates an area in which the anode electrode 210, the light emitting layer 230, and the cathode electrode 250 are sequentially stacked so that holes from the anode electrode 210 and electrons from the cathode electrode 250 are combined with each other in the light emitting layer 230 to emit light. In this case, an area in which the bank 170 is formed does not emit light becomes the non-emission area NEA, and the area in which the anode electrode 210 is not covered by the bank 170 may become the emission area EA. The bank 170 may be formed to cover the edge of the anode electrode 210 and to expose a portion of the anode electrode 210. Accordingly, the bank 170 may prevent a problem in that luminous efficiency is lowered because the current is concentrated on the end of the anode electrode 210.

The bank 170 may be formed as an organic layer such as acrylic resin, epoxy resin, phenolic resin, polyamide resin, and polyimide resin.

The bank 170 may be disposed to cover at least a portion of the first trench portion 161 and the second trench portion 163 described above. Preferably, the bank 170 may be formed so as not to overlap a portion of the bottom surfaces of the first trench portion 161 and the second trench portion 163. For example, in FIG. 3, the bank 170 may overlap at least a portion of the first anode electrode and a bottom surface of the first trench portion 161, or the bank 170 may overlap at least a portion of the second anode electrode and a bottom surface of the second trench portion 163.

In addition, an encapsulation portion (not shown) covering the light emitting device 200, the bank 170, the separation layer 270, and the planarization layer 160 may be further included.

The encapsulation portion may be disposed to overlap the active area AA. According to an example of the present disclosure, the encapsulation portion may include at least one inorganic layer and at least one organic layer. In addition, the encapsulation portion may have a thin film encapsulation structure in which an inorganic layer and an organic layer are alternately arranged, and may prevent moisture or oxygen from penetrating into the light emitting device 200. For example, the encapsulation portion may include a first encapsulation portion, a second encapsulation portion, and a third encapsulation portion being sequentially stacked. In addition, the first encapsulation portion and the third encapsulation portion of the encapsulation portion may be an inorganic layer, and the second encapsulation portion may be an organic layer, but is not limited thereto.

For example, the first encapsulation portion and the third encapsulation portion may include silicon nitride (SiNx), but is not limited thereto. The second encapsulation portion may be an organic material including a resin, but is not limited thereto.

Referring to FIG. 3, the electroluminescence display apparatus according to the present disclosure may have a structure in which the planarization layer 160 including the first and second trench portions 161 and 163, the separation layer 270, the anode electrode 210, and the bank 170 capable of minimizing lateral leakage current occurring in the adjacent emission area EA are combined. In addition, the width of the non-emission area NEA may be reduced, so that the aperture ratio may be improved. Accordingly, in the electroluminescence display apparatus according to the present disclosure, the lateral leakage current is minimized and the width of the non-emission area NEA is reduced, so that the aperture ratio may be improved.

In detail, the width W of the non-emission area NEA may have a symmetrical structure with respect to the separation layer 270. Accordingly, the width W of the non-emission area NEA may be defined as the sum of a first width W1, which is a width of the separation layer 270, a double (two times) of a second width W2 from one end of the bank 170 to the separation layer 270 adjacent to the one end of the bank 170, a double (two times) of a third width W3, which is a width from the end of the bank 170 to the end of the adjacent anode electrode 210, and a double (two times) of a fourth width W4, which is a width from the end of the anode electrode 210 to the other end of the bank 170 adjacent to the emission area EA.

For example, the first width W1 may be set to a minimum width of about 3.5 μm by a patterning process, and the second width W2 may be set to a width of about 1 μm. In this case, the second width W2 may be defined as a distance between one end of the separation layer 270 and one end of the adjacent bank 170 by the structure of the separation layer 270, the first trench portion 161, and the second trench portion 163. Next, the third width W3 and the fourth width W4 may each be set to a width of about 4.5 μm, which will be adjusted according to the formation of the bank 170. Here, the aforementioned width W, first width W1, second width W2, third width W3, and fourth width W4 are all defined as lengths in consideration of only the first direction X.

At this time, in the case of the sum distance of the second width W2 and the third width W3, if the separation layer SL is formed of the same material as the anode electrode 210, it may be difficult to set the minimum width to about 8 um or less due to the patterning margin of the process. However, in the electroluminescence display apparatus according to the present disclosure, when the separation layer SL is formed of a material different from that of the anode electrode 210, the spaced width between the separation layer SL and the anode electrode 210 may be minimized. For example, the distance between the separation layer SL and the anode electrode 210 may be set up to about 3.5 μm. Accordingly, in the structure of FIG. 3, the sum of the second width W2 and the third width W3 may be minimized. For example, the sum of the second width W2 and the third width W3 may be reduced to about 3.5 μm.

Accordingly, in the electroluminescence display apparatus according to an example of the present disclosure, the distance between the separation layer SL and the adjacent anode electrode 210 may be reduced. Accordingly, the width of the non-emission area NEA positioned between the adjacent emission areas EA may be reduced. Therefore, in the electroluminescence display according to an example of the present disclosure, the numerical value of aperture ratio may be improved, compared to the structure of the related art, and a lateral leakage current may be minimized.

Figure 4:
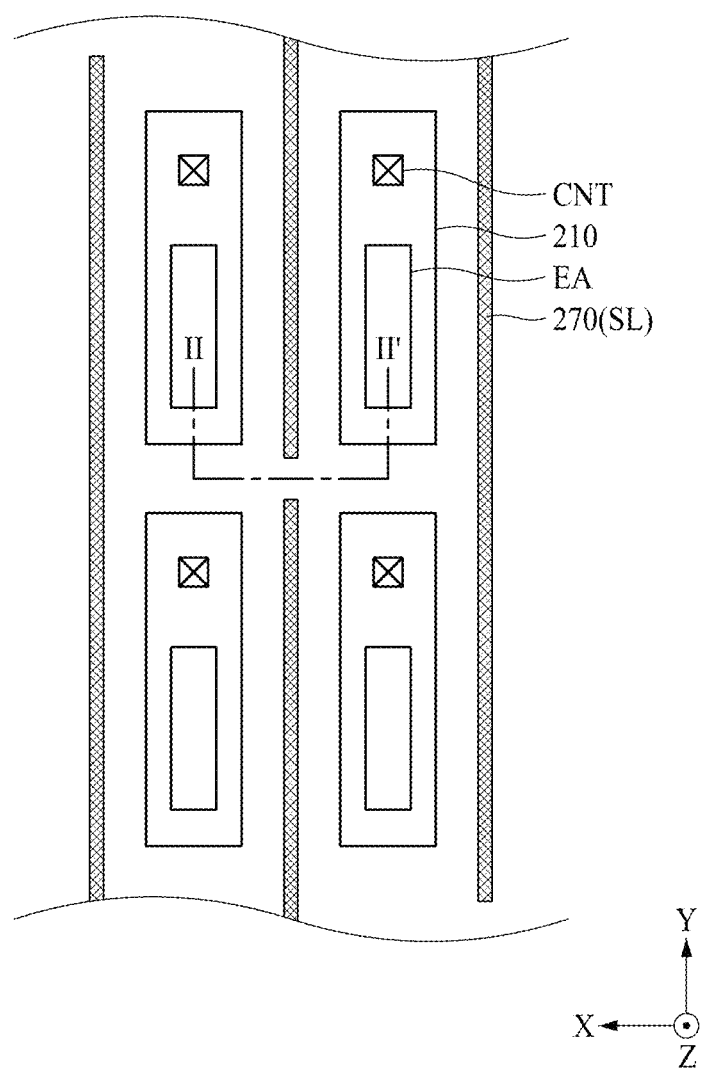
FIG. 4 is a plan view showing region A of FIG. 1 according to another embodiment of the present disclosure.
Figure 5:
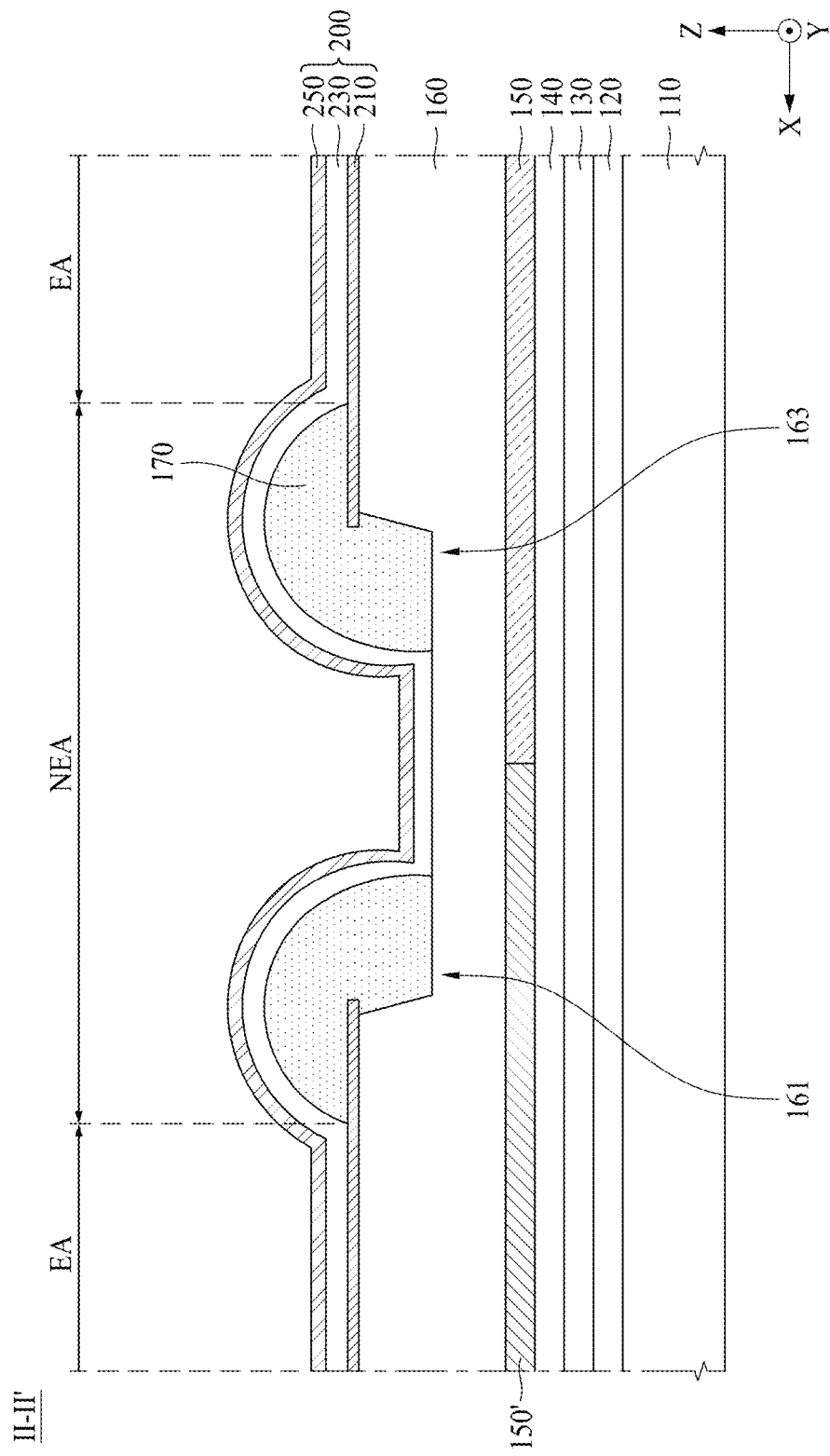
FIG. 5 is a cross-sectional view taken along line II-II' of FIG. 4 according to an embodiment of the present disclosure.

FIG. 4 is a plan view showing region A of FIG. 1 according to another example of the present disclosure, and FIG. 5 is a cross-sectional view taken along line II-II' of FIG. 4. The structure of FIGS. 4 and 5 is the same as the structure of FIGS. 1 to 3, except for an arrangement structure of the separation layer 270, and thus, a redundant description thereof is omitted.

Referring to FIG. 4, the separation layer 270 may be arranged to be parallel to the second direction Y and disposed between adjacent emission areas EA. In addition, at least a portion of the separation layer 270 extending in the second direction Y may be formed in a discontinuous structure. For example, one separation layer 270 may be formed to extend in the second direction Y between a first emission area EA and a second emission area EA. Another separation layer 270 disconnected from the separation layer 270 may be formed between a third emission area EA and a fourth emission area EA. As described above, the separation layer 270 is introduced to reduce a lateral leakage current that may occur in the adjacent emission areas EA. Accordingly, the separation layer 270 is positioned between the adjacent emission areas EA (e.g., first emission area and second emission area) in the first direction X, where the lateral leakage current may act the greatest. However, since the lateral leakage current occurring between one emission area EA and another emission area EA positioned diagonally therefrom is negligible, the separation layer 270 may not be formed here. Therefore, the emission area EA is not disposed on the left and right of the region in which the separation layer 270 is not formed.

Referring to FIG. 5, the light emitting layer 230 and the cathode electrode 250 of the light emitting device 200 may be formed to be connected in the non-emission area NEA in which the separation layer 270 is not formed. Specifically, it has a structure connected in the first trench portion 161 and the second trench portion 163 of the planarization layer 160. In this case, the first trench portion 161 and the second trench portion 163 may have a single trench structure without the separation layer 270. As described above, since the cathode electrode 250 has the connected structure in the region in which the separation layer 270 is not formed in the active area AA, resistance uniformity of the cathode electrode 250 in the active area may be improved in the electroluminescence display according to an example of the present disclosure. Accordingly, image quality and luminance uniformity of the electroluminescence display apparatus may be improved.

As shown in FIGS. 4 and 5, the electroluminescence display apparatus according to an example of the present disclosure may have a structure in which the light emitting layer 230 and the cathode electrode 250 are connected in a partial region of the non-emission area NEA. However, it is connected at the farthest distance between one emission area EA and the other emission area EA located adjacent to the emission area EA in a diagonal direction thereof. Accordingly, a contribution of the occurrence of the lateral leakage current may be very low, and a substantially occurring lateral leakage current is negligible. Therefore, as shown in FIGS. 4 and 5, in the electroluminescence display apparatus according to an example of the present disclosure, the lateral leakage current is reduced, compared with the structure of the related art, although the light emitting layer 230 and the cathode electrode 250 are partially connected. In addition, in the electroluminescence display apparatus according to an example of the present disclosure, resistance uniformity of the cathode electrode 250 in the active area AA may be improved, and thus, image quality and the luminance uniformity of the electroluminescence display apparatus may be improved.

Figure 6:
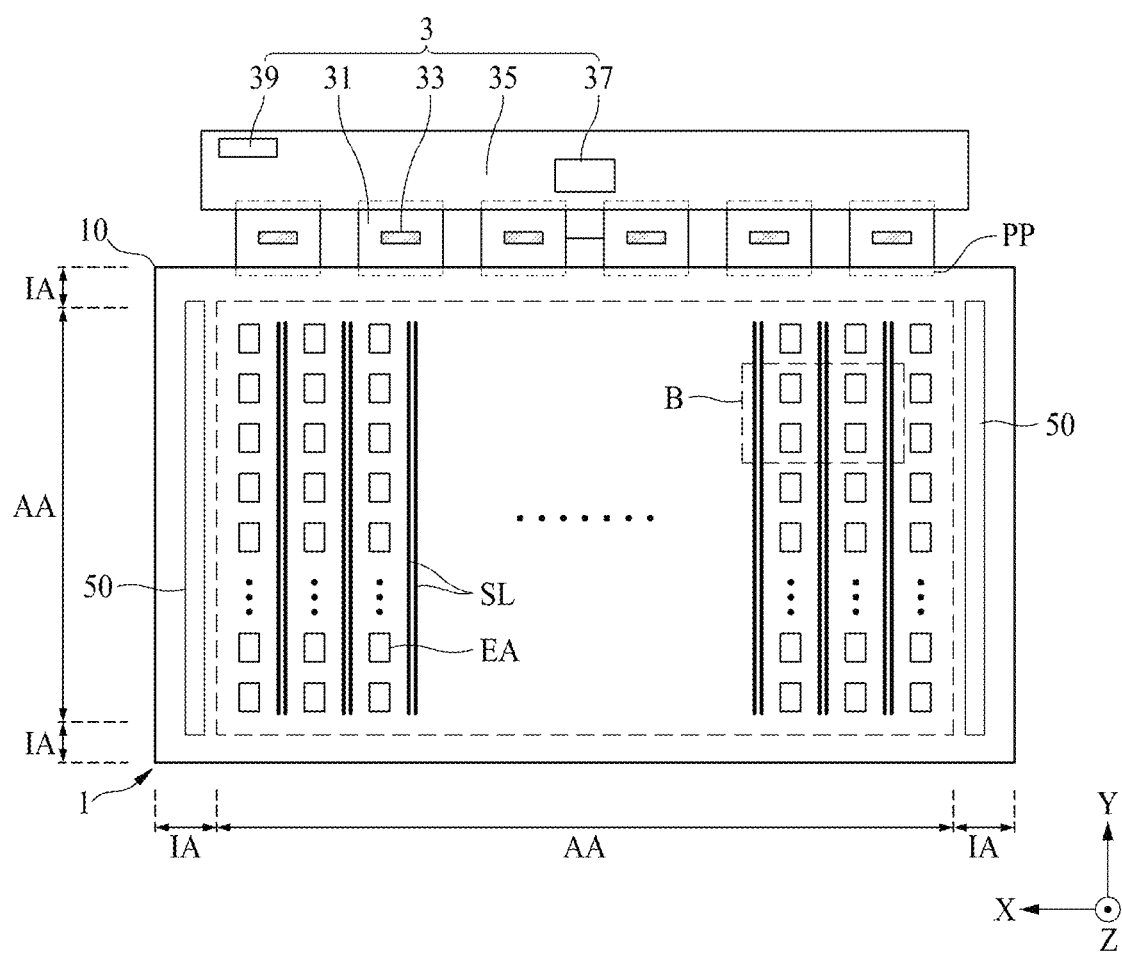
FIG. 6 is a plan view of an electroluminescence display apparatus according to another embodiment of the present disclosure.
Figure 7:
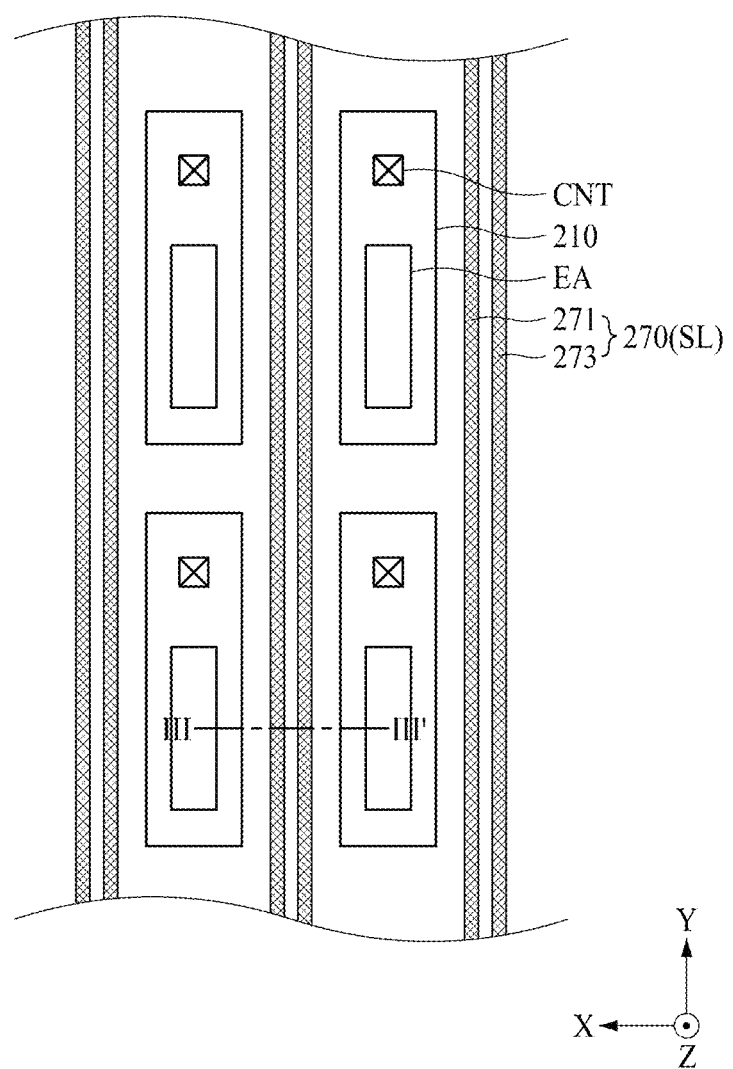
FIG. 7 is a plan view illustrating region B of FIG. 6 according to an embodiment of the present disclosure.
Figure 8:
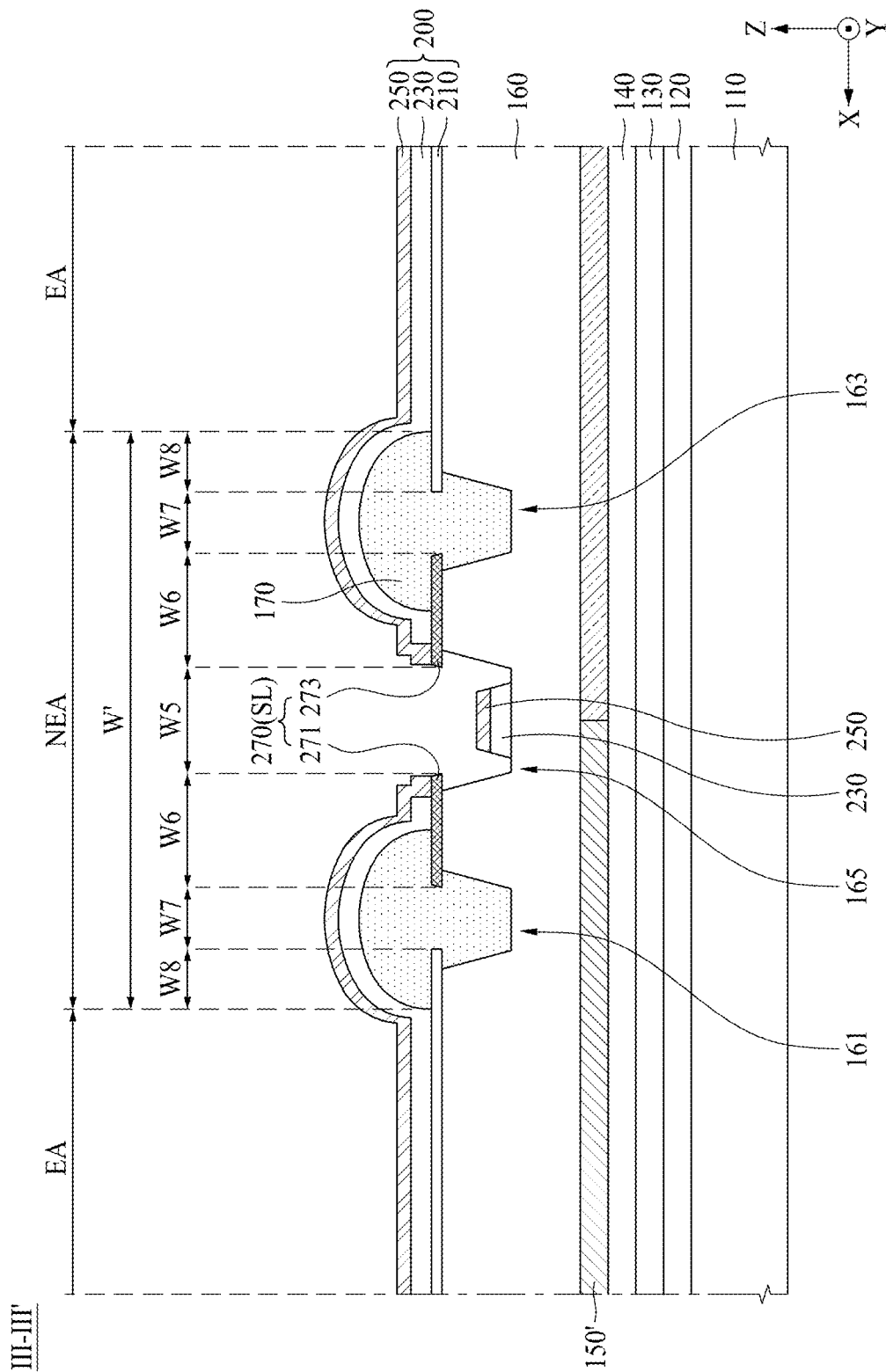
FIG. 8 is a cross-sectional view taken along line III-III' of FIG. 7 according to an embodiment of the present disclosure.

FIG. 6 is a plan view of an electroluminescence display apparatus according to another example of the present disclosure, FIG. 7 is a plan view illustrating region B of FIG. 6, and FIG. 8 is a cross-sectional view taken along line II-II' of FIG. 7. In FIGS. 6 to 8, the electroluminescence display apparatus according to another example of the present disclosure has the same structure except that two separation layers 271 and 273 are disposed in a non-emission area NEA between two adjacent emission areas EA and a third trench portion 165 of the planarization layer 160 is formed between the two separation layers 271 and 273, and thus, the description of the same portion will be omitted.

Referring to FIGS. 6 to 8, the separation layer 270 may include a first separation layer 271 and a second separation layer 273 formed to be spaced apart from each other. In addition, the planarization layer 160 may be formed between the first separation layer 271 and the second separation layer 273 and the third trench portion 165 formed by removing at least a portion of the planarization layer 160 may be further included. For example, in FIG. 8, the planarization layer 160 may be formed with a first trench portion 161 and a third trench portion 165 and a part of the planarization layer 160 may remain between the first trench portion 161 and the third trench portion 165. The planarization layer 160 may also be formed with a second trench portion 163 and another part of the planarization layer 160 may remain between the second trench portion 163 and the third trench portion 165.

Therefore, in the electroluminescence display apparatus according to another example of the present disclosure, the first separation layer 271, the second separation layer 273, and the third trench portion 165 disposed between the first separation layer 271 and the second separation layer 273 may be formed between two emission areas EA adjacent to each other. The light emitting layer 230 and the cathode electrode 250 may be discontinuously formed in the third trench portion 165 disposed between the first separation layer 271 and the second separation layer 273. For example, a portion of the light emitting layer 230 and the cathode electrode 250 may be formed to overlap the first separation layer 271 and the second separation layer 273 in the non-emission area NEA, and may be discontinuously formed in the third trench portion 165. Specifically, the light emitting layer 230 and the cathode electrode 250 of the two adjacent light emitting devices may be disposed on the planarization layer 160, the first separation layer 271, and the second separation layer 273, and may overlap at least a portion of both sidewalls of the third trench portion 165. For example, the first separation layer 271 may protrude beyond a sidewall of the first trench portion 161 that corresponds to a side surface of the part of the planarization layer 160, and may also protrude beyond a sidewall of the third trench portion 165 that corresponds to another side surface of the part of the planarization layer 160. The second separation layer 273 may protrude beyond a sidewall of the second trench portion 163 that corresponds to a side surface of the another part of the planarization layer 160, and may also protrude beyond another sidewall of the third trench portion 165. The light emitting layer 230 and the cathode electrode 250 may be disconnected from the first separation layer 271 and the second separation layer 273 and overlap at least a portion of the bottom side of the third trench portion 165.

At least a portion of the first separation layer 271 and the second separation layer 273 overlaps the sidewall of the third trench portion 165 and protrudes so as not to overlap the upper surface of the planarization layer 160. When the first separation layer 271 and the second separation layer 273 are disposed on the upper surface of the planarization layer 160, they may be disposed on both sides of the third trench portion 165. One side surface of the first separation layer 271 protrudes more than one sidewall of the third trench portion 165, and one side surface of the second separation layer 273 may be formed to protrude more than the other side facing one side of the third trench portion 165. Through this structure, the light emitting layer 230 and the cathode electrode 250 of the light emitting device 200 described above may be provided in a discontinuous structure based on the first separation layer 271 and the second separation layer 273 as a boundary.

A plurality of the first separation layer 271 and a plurality of the second separation layer 273 may be provided to have a size corresponding to the emission area EA, and the first separation layer 271 and the second separation layer 273 may be located only between the emission areas EA based on the emission areas EA of the first row of the active area AA in the first direction X. Thus, when number N emission areas EA of the first row in the first direction X are prepared, each of the first separation layer 271 and the second separation layer 273 may be formed by number N−1 because they are located only between the number N emission areas EA in the first row.

As shown in FIG. 8, the anode electrode 210 has a structure disconnected from the first and second separation layers 271 and 273, a structure in which a short circuit does not occur with the cathode electrode 250 disposed on the first and second separation layers 271 and 273 may be provided.

The electroluminescence display apparatus according to another example of the present disclosure may have the structure in which the planarization layer 160 including the first, second, and third trench portions 161, 163, and 165, the separation layer 270 including the first separation layer 271 and the second separation layer 273, the anode electrode 210, and the bank 170 are combined to minimize a lateral leakage current occurring in the neighboring emission areas EA. In addition, the width of the non-emission area NEA may be reduced, so that the aperture ratio may be improved. Accordingly, in the electroluminescence display apparatus according to another example of the present disclosure, the lateral leakage current is minimized and the width of the non-emission area NEA is reduced, so that the aperture ratio may be improved.

Specifically, a width W' of the non-emission area NEA has a horizontal symmetric structure based on the fifth width W5 between the first separation layer 271 and the second separation layer 273. Accordingly, the width W' of the non-emission area NEA may be defined as the sum of a fifth width W5 between the first separation layer 271 and the second separation layer 273, a double (two times) of a sixth width W6, which is a width of the first separation layer 271, a double (two times) of a seventh width W7, which is a width between the ends of the first separation layer 271 and the anode electrode 210 adjacent to each other, and a double (two times) of an eighth width W8, which is a width from the end of the anode electrode 210 positioned at a region overlapping the bank 170 to an end of the bank 170 adjacent to the emission area EA.

For example, the fifth width W5, the sixth width W6, and the seventh width W7 may be set to a minimum width of about 3.5 μm by a patterning process. Next, the eighth width W8 may be set to a minimum width of about 4.5 μm, and the eighth width W8 may be adjusted according to the formation of the bank 170. Here, the width W', fifth width W5, sixth width W6, seventh width W7, and eighth width W8 are all defined by lengths in consideration of only the first direction X.

As described above, the fifth width W5 may be set to a minimum width of about 3.5 μm by a patterning process. To this end, the first separation layer 271 and the second separation layer 273 may be prepared of a material different from that of the anode electrode 210.

In the case of the fifth width W5 and the seventh width W7, if the anode electrode 210, the first separation layer 271, and the second separation layer 273 are all formed of the same material, it may be difficult to set the minimum spaced width to less than about 8 μm due to a patterning margin of the process. However, in the electroluminescence display apparatus according to another example of the present disclosure, the first separation layer 271 and the second separation layer 273 are formed of a material different from that of the anode electrode 210 so that each of the anode electrode 210, the first separation layer, and the second separation layer 273 may be set to have a minimum spaced width from each other, for example, a minimum of about 3.5 μm.

Accordingly, in the electroluminescence display apparatus according to another example of the present disclosure, a distance between the separation layer SL and the adjacent anode electrode 210 may be reduced, and in other words, a width of the non-emission area NEA located between the adjacent emission areas EA may be reduced. Accordingly, in the electroluminescence display according to an example of the present disclosure, a numerical value of an aperture ratio may be improved, compared to the structure of the related art, and a lateral leakage current may be minimized.

Figure 9:
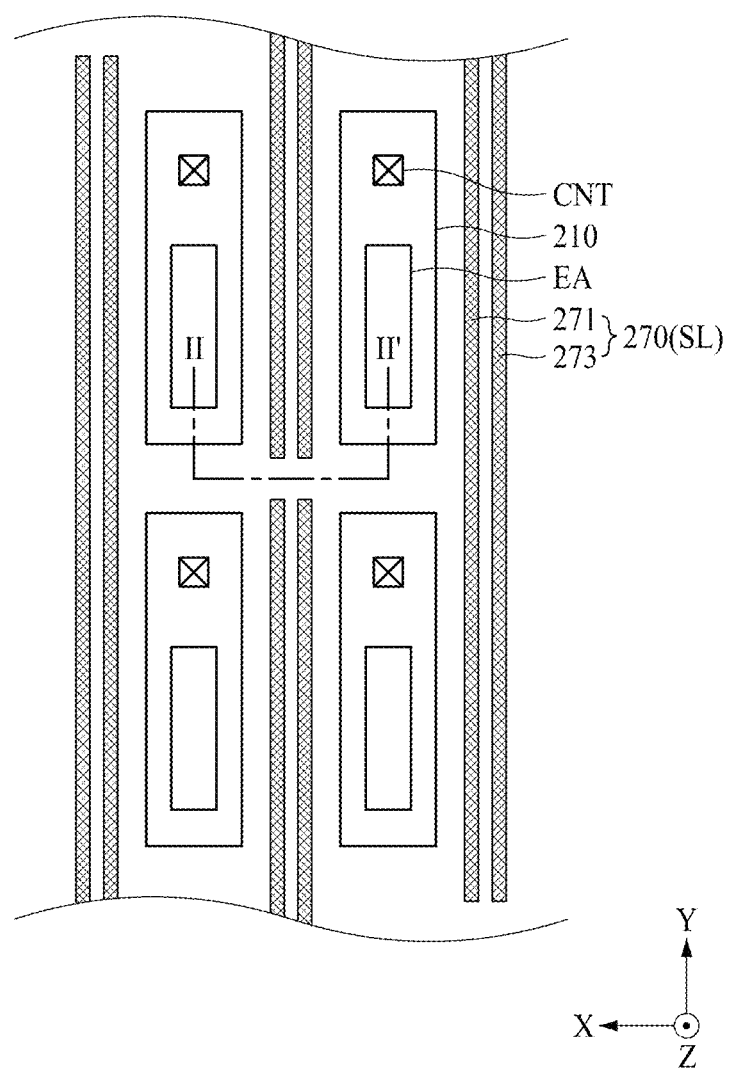
FIG. 9 is a plan view illustrating region B of FIG. 6 according to another embodiment of the present disclosure.
Figure 10:
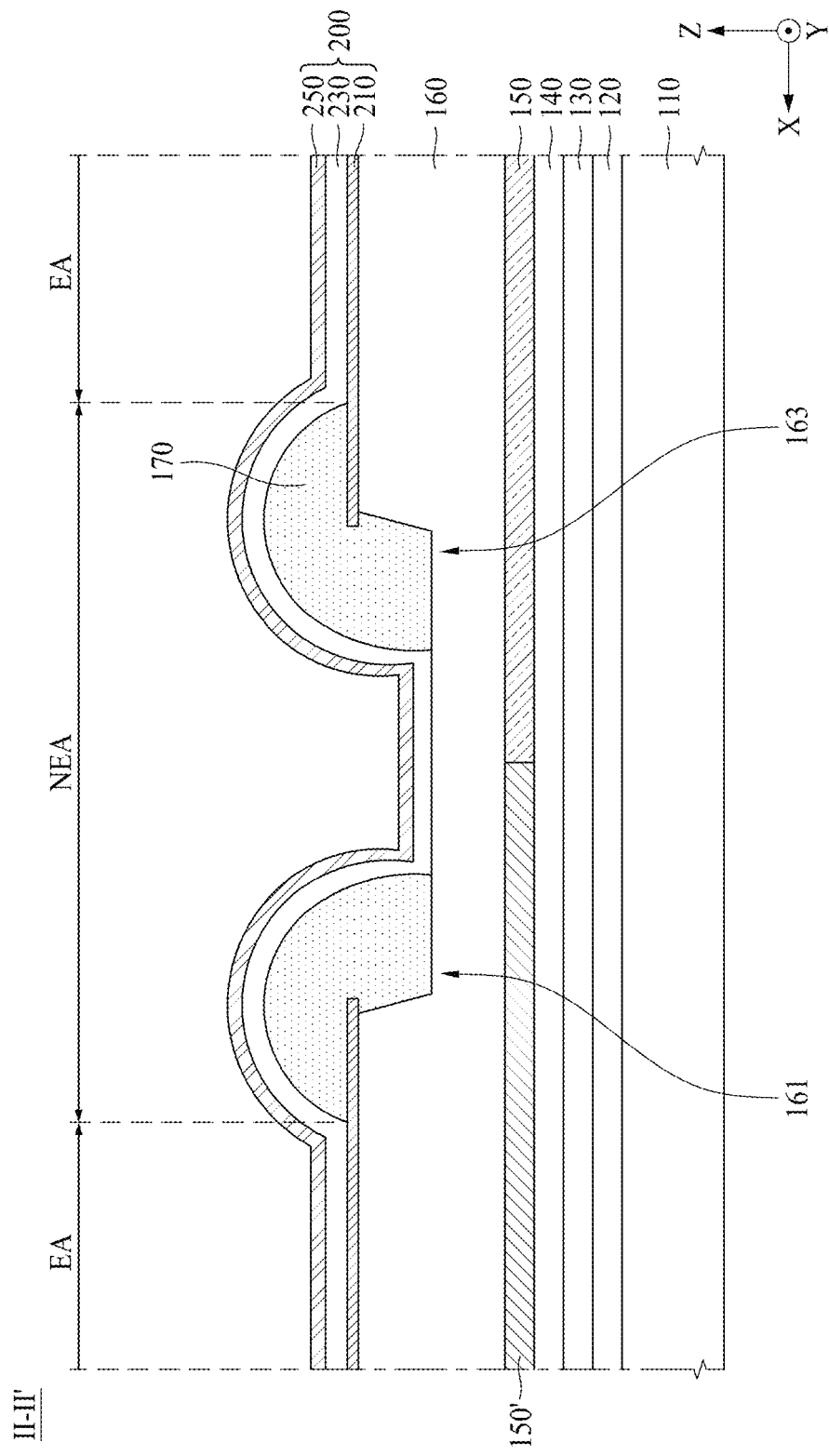
FIG. 10 is a cross-sectional view taken along line II-II' of FIG. 9 according to an embodiment of the present disclosure.

FIG. 9 is a plan view showing region B of FIG. 6 according to another example of the present disclosure, and FIG. 10 is a cross-sectional view taken along line II-II' of FIG. 9. Here, the cross-sectional structure of FIG. 10 may be the same as the cross-sectional structure of FIG. 5 described above. Therefore, a repeated description will be omitted.

Referring to FIG. 9, the first separation layer 271 and the second separation layer 273 may be arranged to be parallel to the second direction Y and disposed between adjacent emission areas EA. However, at least a portion of the first separation layer 271 and the second separation layer 273 may be formed in a discontinuous structure. As described above, the first separation layer 271 and the second separation layer 273 are introduced to reduce a lateral leakage current that may occur in the adjacent emission areas EA. Accordingly, the first separation layer 271 and the second separation layer 273 are positioned between the adjacent emission areas EA in the first direction X, where the lateral leakage current may act the greatest. However, since the lateral leakage current occurring between one emission area EA and another emission area EA positioned diagonally therefrom is negligible, the first separation layer 271 and the second separation layer 273 may not be formed here.

Referring to FIG. 10, the light emitting layer 230 and the cathode electrode 250 of the light emitting device 200 may be formed to be connected in the non-emission area NEA in which the first separation layer 271 and the second separation layer 273 are not formed. Specifically, it has a structure connected in the first trench portion 161 and the second trench portion 163 of the planarization layer 160. In this case, the first trench portion 161 and the second trench portion 163 may have a single trench structure without the separation layer 270. As described above, since the cathode electrode 250 has the connected structure in the region in which the first separation layer 271 and the second separation layer 273 are not formed in the active area AA, resistance uniformity of the cathode electrode 250 in the active area may be improved in the electroluminescence display according to an example of the present disclosure. Accordingly, image quality and luminance uniformity of the electroluminescence display apparatus may be improved.

As shown in FIGS. 9 and 10, the electroluminescence display apparatus according to another example of the present disclosure may have a structure in which the light emitting layer 230 and the cathode electrode 250 are connected in a partial region of the non-emission area NEA. However, it is connected at the farthest distance between one emission area EA and the other emission area EA located adjacent to the emission area EA in a diagonal direction thereof. Accordingly, a contribution of the occurrence of the lateral leakage current may be very low, and a substantially occurring lateral leakage current is negligible. Therefore, as shown in FIGS. 9 and 10, in the electroluminescence display apparatus according to another example of the present disclosure, the lateral leakage current is reduced, compared with the structure of the related art, although the light emitting layer 230 and the cathode electrode 250 are partially connected. In addition, in the electroluminescence display apparatus according to another example of the present disclosure, resistance uniformity of the cathode electrode 250 in the active area AA may be improved, and thus, image quality and the luminance uniformity of the electroluminescence display apparatus may be improved.

Figure 13:
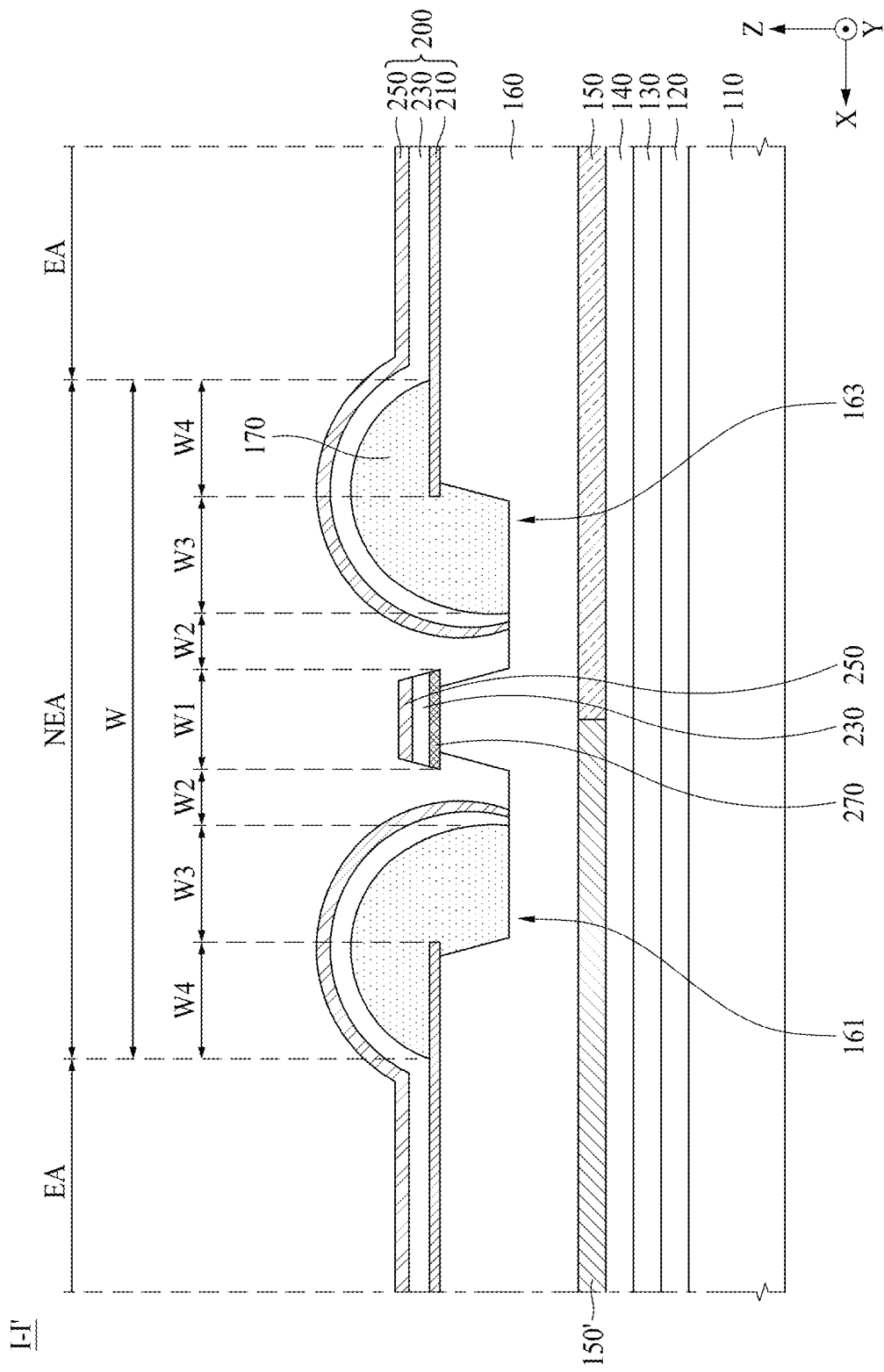
FIG. 13 is a cross-sectional view taken along line I-I' of FIG. 12 according to an embodiment of the present disclosure.

FIG. 11 is a plan view of an electroluminescence display apparatus according to another example of the present disclosure, FIG. 12 is a plan view illustrating region C of FIG. 11, and FIG. 13 is a cross-sectional view taken along line I-I' of FIG. 12. FIGS. 10 to 13 has the same structure as the electroluminescence display apparatus of FIG. 1 or FIG. 6, except that an arrangement structure of the emission area EA and the separation layer SL is changed, and thus a redundant description will be omitted.

In FIG. 11, the subpixel structure including the emission areas EA classified as a C region may be configured as a kind of quad structure, and a region including four emission areas EA like the C region may be defined as one unit pixel. In one unit pixel, when a square is divided into quadrants, one subpixel or an emission area may be formed in each quadrant. However, a pixel structure of the electroluminescence display apparatus according to the present disclosure is not limited thereto, and various known structures such as a stripe type, a diamond type, and a pentile type may be applied.

Accordingly, when the structure of the emission area EA is implemented in a square shape like the quad structure described above, shortest distances between one emission area EA and the first direction X and the second direction Y may be formed at the same level. Accordingly, in order to reduce a lateral leakage current that may occur between the adjacent emission areas EA, the separation layer 270 may be formed to be parallel to the first direction X and the second direction Y. Also, the separation layer 270 may not be formed in a direction adjacent to one emission area EA in a diagonal direction.

Accordingly, a plurality of separation layers 270 may be provided to have a size corresponding to the emission area EA, and the separation layers 270 may be formed only between the emission areas EA based on the emission areas EA of the first row in the first direction X of the active area AA. Thus, when number m emission areas EA of the first row in the first direction X are prepared, number m−1 separation layers 270 may be formed because the separation layer 270 is positioned only between the number m emission areas EA of the first row. In addition, since the separation layer 270 is located only between the emission areas EA based on the emission areas EA of a first column in the second direction Y of the active area AA, when number M emission areas EA of the first column of the second direction are prepared, number M−1 separation layers 270 may be formed because the separation layer 270 is positioned only between number M emission areas EA of the first column.

In addition, when the emission area is formed in a circular and elliptical structure or an indeterminate structure, the separation layer 270 may be formed between the other emission area EA adjacent to one emission area EA as illustrated in FIG. 11.

In FIG. 12, a subpixel including the emission area EA on the upper left may be a white subpixel, a subpixel including the emission area EA on the upper right may be a red subpixel, a subpixel including the emission area EA on the lower left may be a green subpixel, and a subpixel including the emission area EA on the lower right may be a blue subpixel. However, an arrangement structure of the emission area EA or the subpixel according to the present disclosure is not limited thereto.

FIGS. 14A to 14F are views illustrating a method of manufacturing an electroluminescence display apparatus according to the present disclosure.

Figure 14A:
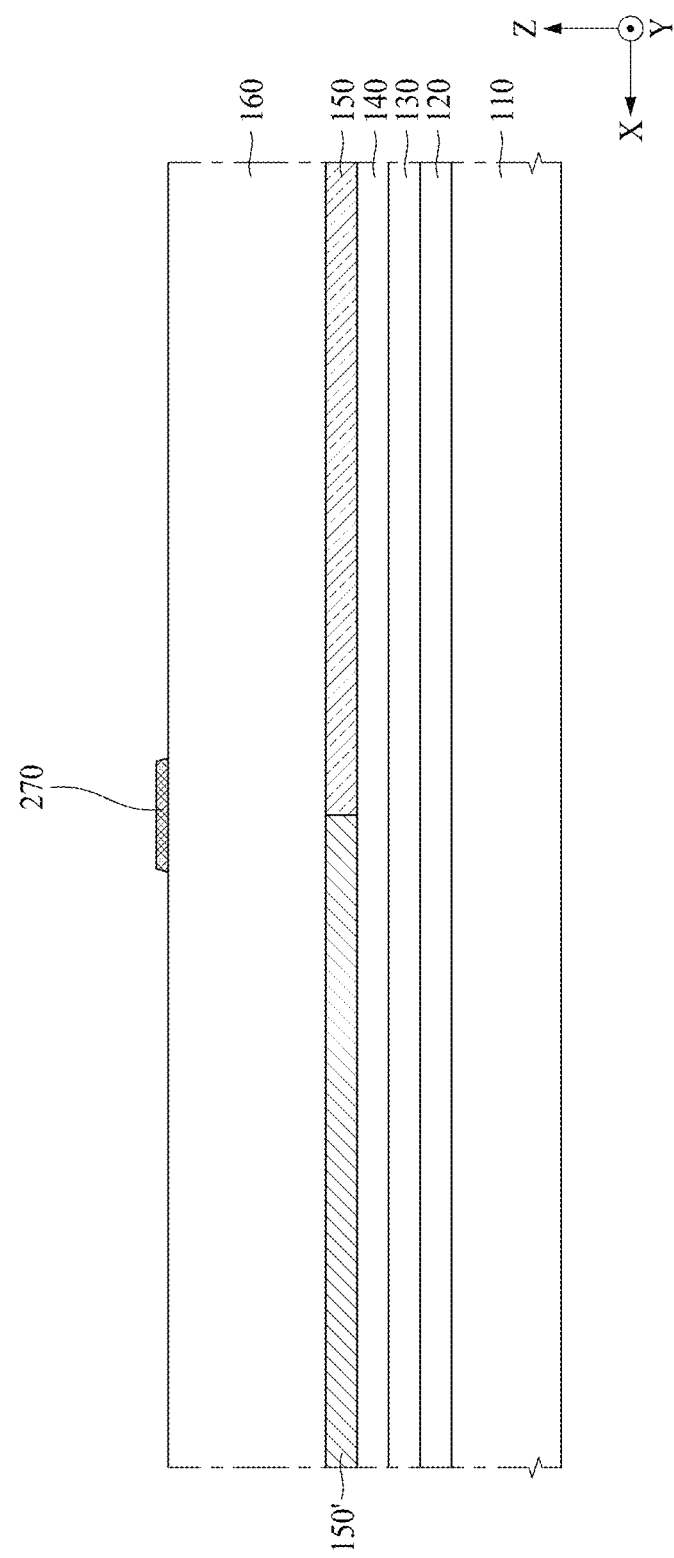

First, referring to FIG. 14A, the buffer layer 120, the interlayer insulating layer 130, the protective layer 140, the color filters 150 and 150', and the planarization layer 160 are formed on the substrate 110, and the separation layer 270 is formed. In this case, the separation layer 270 may be patterned to have a preset width.

Figure 14B:
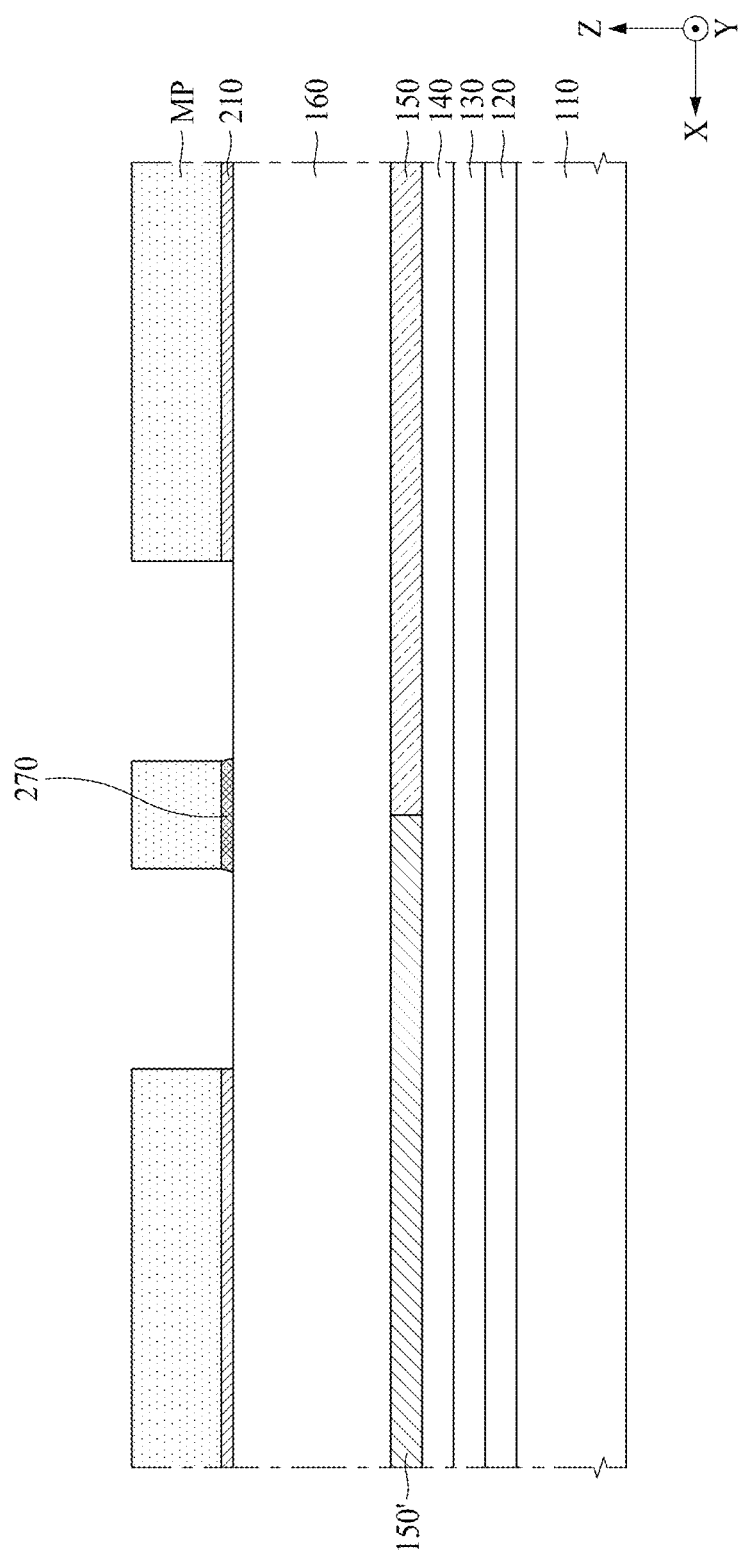

Next, referring to FIG. 14B, the anode electrode 210 is formed to correspond to each emission area, and a mask pattern MP may be formed to overlap the anode electrode 210 and the separation layer 270. In this case, the mask pattern MP may be a photoresist pattern for a photolithography process.

Figure 14D:
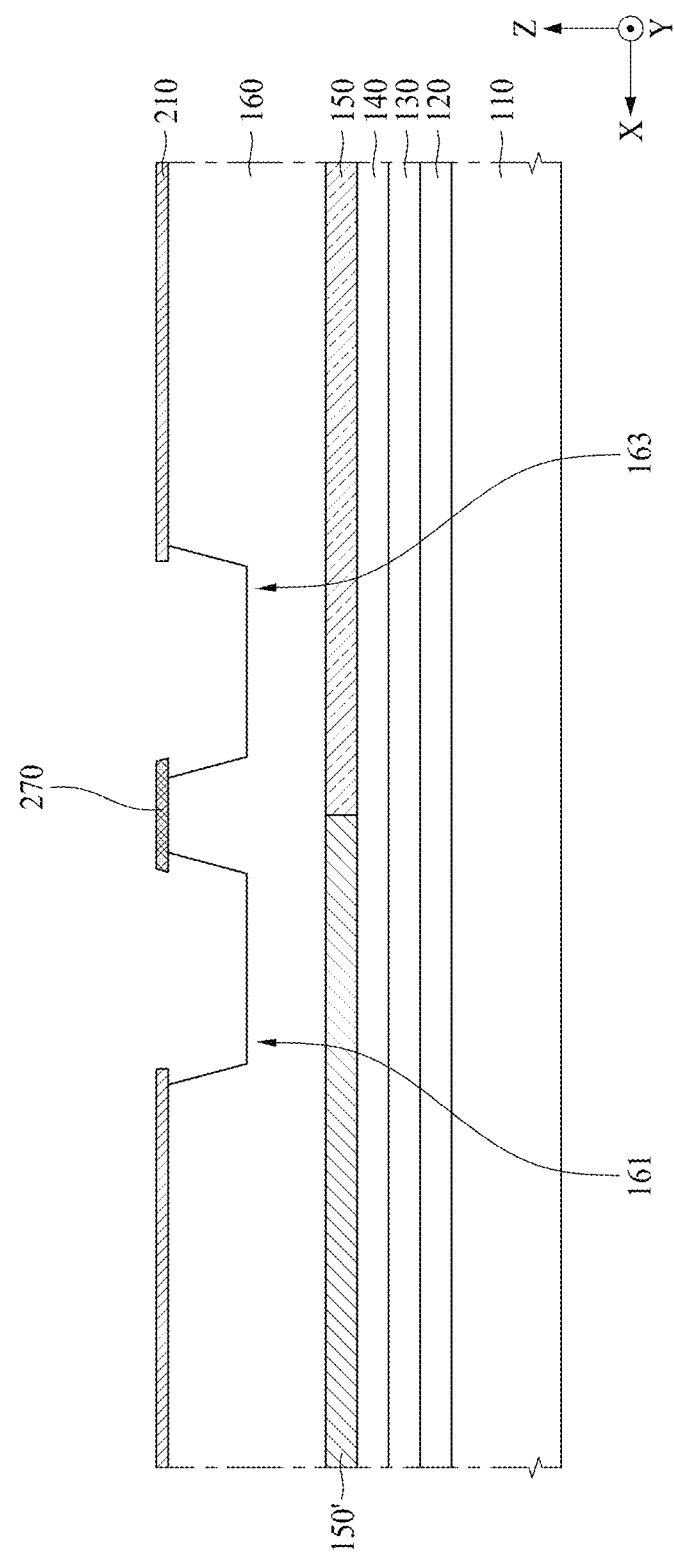

Next, referring to FIGS. 14C and 14D, an etching process may be performed using the mask pattern MP. In this case, the anode electrode 210 and the separation layer 270 may each act as a predetermined mask for the etching process. At this time, the etching process may be performed by appropriately setting an etch rate for a material constituting the planarization layer 160, and as shown in FIG. 14D, the first trench portion 161 and the second trench portion 163 may be formed to overlap at least a portion of the anode electrode 210 and the separation layer 270, and the anode electrode 210 and the separation layer 270 may be formed in a structure in which a portion thereof protrudes toward the first trench portion 161 or the second trench portion 163 so that the anode electrode 210 and the separation layer 270 do not overlap an upper surface of the planarization layer 160.

Figure 14E:
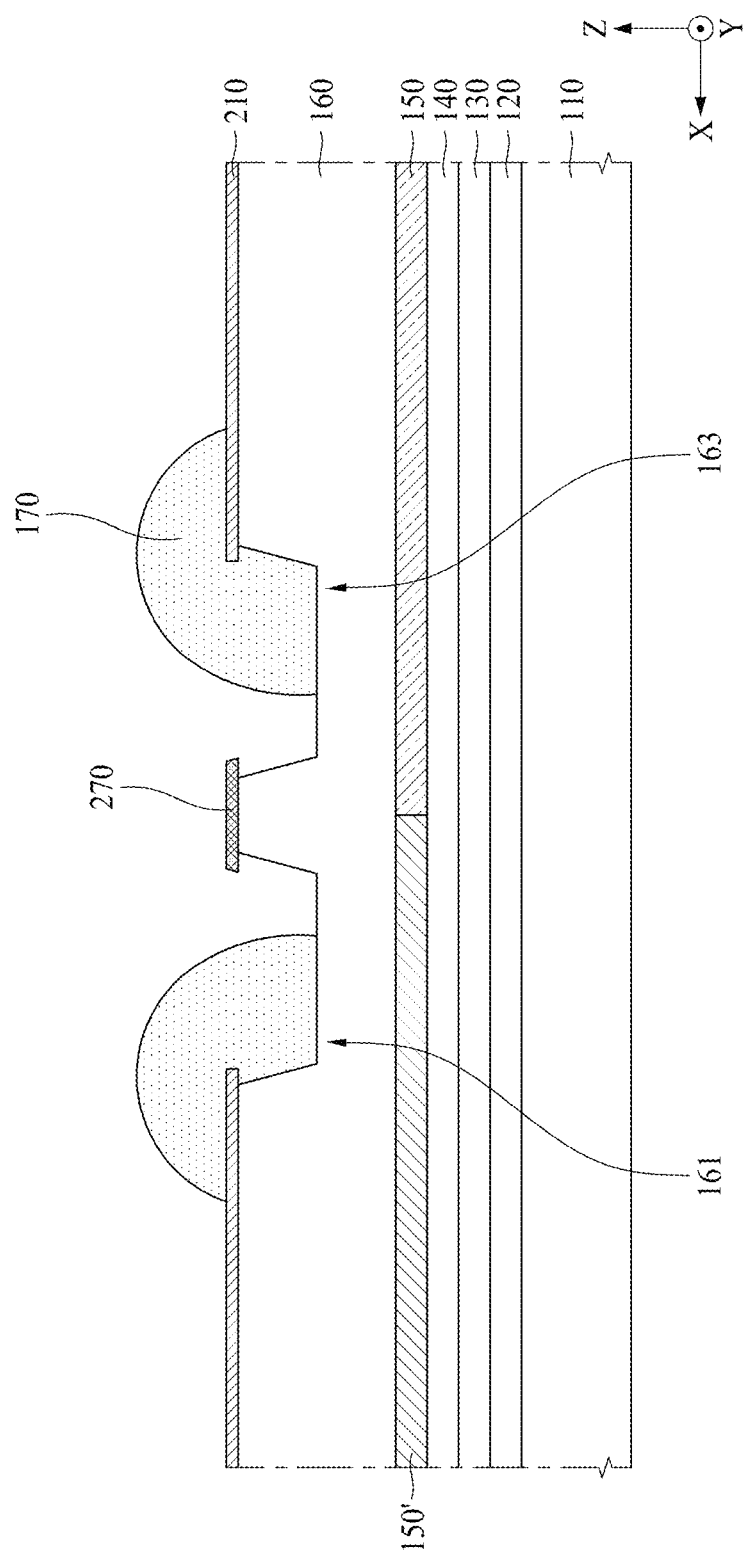
Figure 14F:
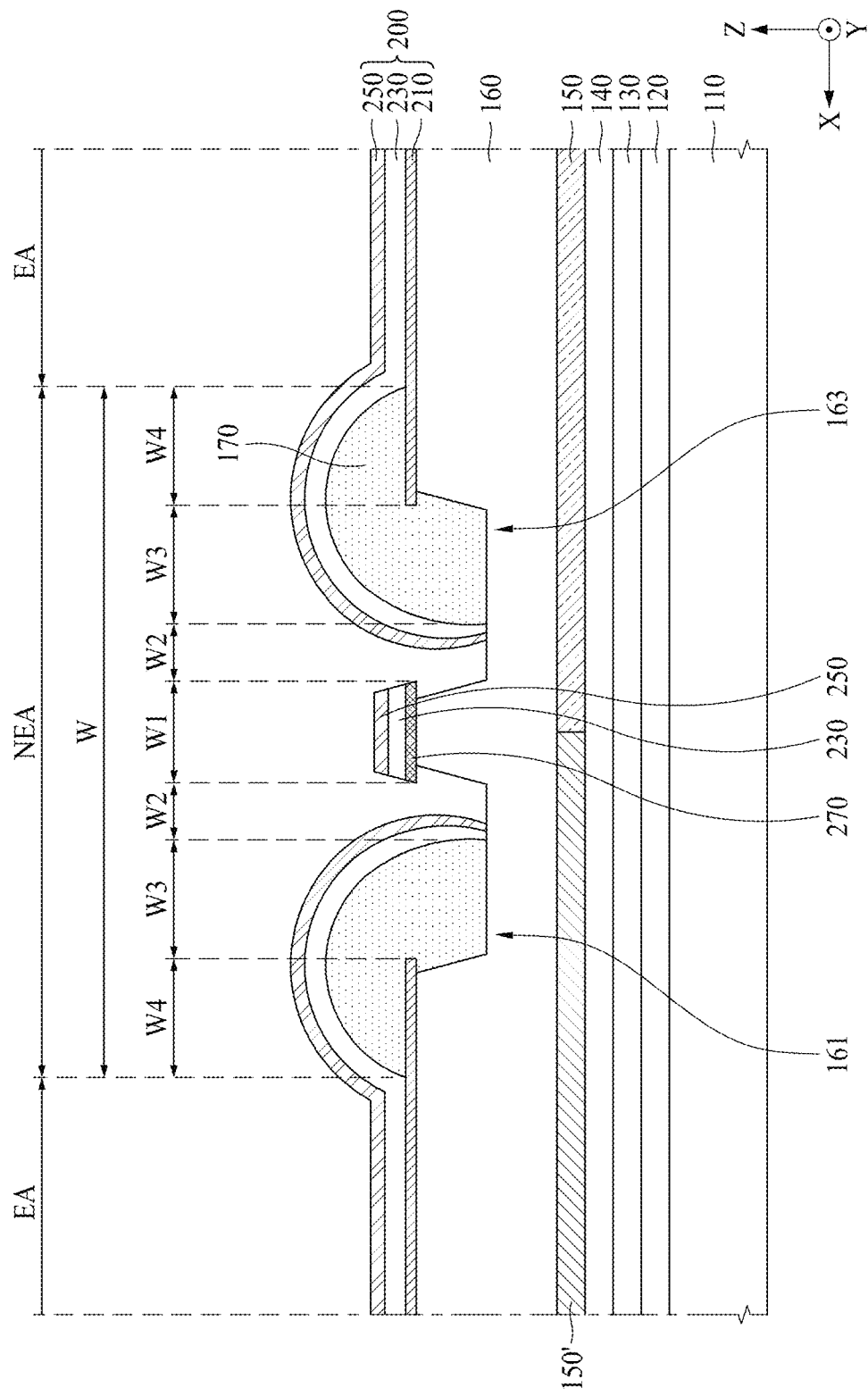

Next, referring to FIGS. 14E and 14F, the bank 170 may be formed to overlap at least a portion of the anode electrode 210 and the first and second trench portions 161 and 163, and the light emitting layer 230 and the cathode electrode 250 of the light emitting device 200 may be formed. At this time, the light emitting layer 230 and the cathode electrode 250 may be formed without a mask pattern as described above, and due to the structure in which the first and second trench portions 161 and 163 and the separation layer 270 are combined, the light emitting layer 230 and the cathode electrode 250 may be formed in a discontinuous structure in the first and second trench portions 161 and 163 and the separation layer 270.

Figure 15:
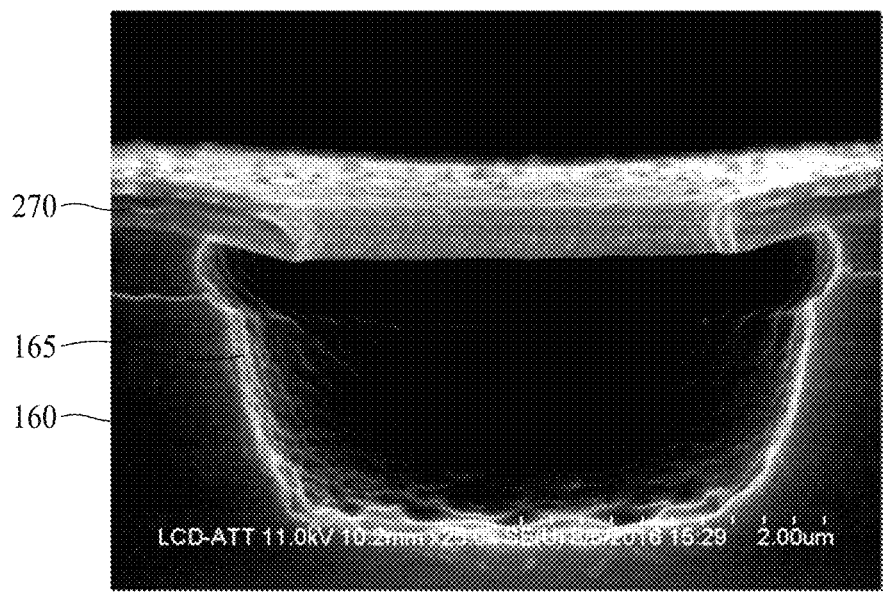
FIG. 15 is a photograph taken with a scanning electron microscope of a structure of a planarization layer including a trench portion and a separation layer.

FIG. 15 is a scanning electron microscope (SEM) photograph of a structure of a planarization layer including a trench portion and a separation layer.

Referring to FIG. 15, the separation layer 270 was formed on the planarization layer 160, and the trench portion 165 was formed by performing an etching process. At this time, when the trench portion 165 was formed, it was confirmed that both side surfaces or both sides of the trench portion 165 are formed to overlap at least a portion of the separation layer 270 by appropriately adjusting an etch rate of the planarization layer 160. In this case, the trench portion 165 may have the same structure as the third trench portion 165 described above with reference to FIG. 8. Accordingly, as shown in FIG. 15, it can be seen that both sidewalls of the trench portion 165 overlap at least a portion of the separation layer 270. In other words, at least a portion of the separation layer 270 may be formed to protrude so as to overlap the sidewall of the trench portion 165, and through this structure, the light emitting layer 230 and the cathode electrode 250 of the light emitting device 200 described above may be provided in a discontinuous structure based on the separation layer 270 as a boundary.

According to an example of the present disclosure, the lateral leakage current of the electroluminescence display apparatus is reduced, thereby improving reliability.

In addition, according to an example of the present disclosure, the lateral leakage current of the electroluminescence display apparatus is reduced and the aperture ratio is improved at the same time.

The effect of the present disclosure is not limited to the above-mentioned effects, and other effects not mentioned will be clearly understood by those skilled in the art from the following description.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations may be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An electroluminescence display apparatus comprising:
   a substrate including an emission area and a non-emission area surrounding the emission area;
   a planarization layer formed on the substrate;
   a light emitting device disposed on the planarization layer, overlapping the emission area, and including an anode electrode; and
   a separation layer disposed to be spaced apart from the anode electrode on the planarization layer and disposed to be parallel to a first direction or a second direction in at least a portion of the non-emission area between one emission area and another emission area adjacent to the one emission area,
   wherein the planarization layer is formed to overlap at least a portion of the non-emission area and includes a trench portion formed by removing at least a portion of the planarization layer,
   the trench portion at least partially overlaps an end of each of the anode electrode and the separation layer in the non-emission area,
   the light emitting device further includes a portion of a light emitting layer and a portion of a cathode electrode sequentially formed on the anode electrode, and
   the portion of the light emitting layer and the portion of the cathode electrode are discontinuously formed in the trench portion and is disconnected from another portion of the light emitting layer and another portion of the cathode electrode on the planarization layer.

2. The electroluminescence display apparatus of claim 1, wherein the separation layer includes a material different from the anode electrode.

3. The electroluminescence display apparatus of claim 1, wherein:
   the anode electrode includes a transparent conductive oxide, and
   the separation layer includes at least one of silicon oxide (SiOx), silicon nitride (SiN), and silicon oxynitride (SiON).

4. The electroluminescence display apparatus of claim 1, wherein the trench portion includes:
   a first trench portion disposed to be adjacent to the one emission area; and
   a second trench portion disposed to be adjacent to the another emission area adjacent to the one emission area.

5. The electroluminescence display apparatus of claim 4, wherein:
   the first trench portion overlaps one end of the separation layer and overlaps one end of the anode electrode of the one emission area, and
   the second trench portion overlaps the other end of the separation layer and overlaps one end of the anode electrode of the another emission area.

6. The electroluminescence display apparatus of claim 5, further comprising:
   a bank disposed on the planarization layer and disposed to surround an outer side of the emission area,
   wherein the bank overlaps at least a portion of the trench portion.

7. The electroluminescence display apparatus of claim 6, wherein:
   the bank disposed adjacent to the one emission area overlaps one side surface of the first trench portion and at least partially overlaps a bottom surface of the first trench portion, and
   the bank disposed adjacent to the another emission area overlaps one side surface of the second trench portion and at least partially overlaps a bottom surface of the second trench portion.

8. The electroluminescence display apparatus of claim 6, wherein:
   the portion of the light emitting layer and the portion of the cathode electrode are disposed to overlap the bank, and
   the another portion of the light emitting layer and the another portion of the cathode electrode are disposed to overlap the separation layer.

9. The electroluminescence display apparatus of claim 4, wherein:
   the separation layer includes a first separation layer and a second separation layer formed to be spaced apart from each other, and
   the planarization layer further includes a third trench portion formed between the first separation layer and the second separation layer and formed by removing at least a portion of the planarization layer.

10. The electroluminescence display apparatus of claim 9, wherein the third trench portion overlaps at least a portion of the first separation layer and the second separation layer.

11. The electroluminescence display apparatus of claim 9, wherein the anode electrode includes a transparent conductive oxide, and the first separation layer and the second separation layer include at least one of silicon oxide (SiOx), silicon nitride (SiN), and silicon oxynitride (SiON).

12. The electroluminescence display apparatus of claim 1, wherein the separation layer includes a separation layer non-formed area in which at least a portion of the separation layer is formed to have a discontinuous structure in the first direction or the second direction.

13. The electroluminescence display apparatus of claim 12, wherein the cathode electrode is commonly formed in the separation layer non-formed area.

14. A display apparatus comprising:
   a substrate including a plurality of emission areas of a plurality of subpixels, the plurality of emission areas including a first emission area of a first subpixel and a second emission area of a second subpixel with a non-emission area disposed therebetween;

a planarization layer on the substrate, the planarization layer having a first trench adjacent to the first emission area and a second trench adjacent to the second emission area, at least a part of the planarization layer disposed between the first trench and the second trench;

a first light emitting device disposed on a first upper surface of the planarization layer in at least the first emission area and a second light emitting device disposed on a second upper surface of the planarization layer in at least the second emission area; and at least one separation layer disposed on the part of the planarization layer, wherein at least one end of the separation layer protrudes beyond a side surface of the part of the planarization layer.

15. The display apparatus of claim 14,
wherein the first light emitting device includes a first anode electrode disposed on the first upper surface of the planarization layer and the second light emitting device includes a second anode electrode disposed on the second upper surface of the planarization layer, and wherein a material of the separation layer is different from a material of the first anode electrode and the second anode electrode.

16. The display apparatus of claim 15, wherein the first anode electrode and the second anode electrode include a transparent conductive oxide, and the separation layer includes at least one of silicon oxide (SiOx), silicon nitride (SiN), and silicon oxynitride (SiON).

17. The display apparatus of claim 15, wherein the first anode electrode protrudes beyond a sidewall of the first trench or the second anode electrode protrudes beyond a sidewall of the second trench.

18. The display apparatus of claim 14,
wherein at least one of the first light emitting device or the second light emitting device includes at least a portion of a light emitting layer and at least a portion of a cathode electrode, and wherein another portion of the light emitting layer and another portion of the cathode electrode is disposed on the separation layer, and the another portion of the light emitting layer and the another portion of the cathode electrode are physically disconnected from the portion of the light emitting layer and the portion of the cathode electrode.

19. The display apparatus of claim 14, further comprising a bank disposed on at least a portion of the first anode electrode and a bottom surface of the first trench, and wherein the portion of the light emitting layer and the portion of the cathode electrode extends to be disposed on the bank.

20. The display apparatus of claim 14, wherein the plurality of subpixels are arranged in one or more rows and one or more columns, and wherein the separation layer extends in a first direction between a row of subpixels or the separation layer extends in a second direction between a column of subpixels.

21. The display apparatus of claim 20,
wherein the at least one separation layer further includes a second separation layer disposed between a third emission area of a third subpixel and a fourth emission area of a fourth subpixel, wherein the second separation layer is disconnected from the separation layer, and wherein in a region where the separation layer is disconnected from the second separation layer, the planarization layer is formed with a single trench.

22. The display apparatus of claim 14, wherein the planarization layer has a third trench, and the part of the planarization layer is between the first trench and the third trench, and wherein another part of the planarization layer is between the third trench and the second trench, and further comprising:

a second separation layer disposed on the another part of the planarization layer, wherein at least one end of the second separation layer protrudes beyond a side surface of the another part of the planarization layer.

23. The display apparatus of claim 22,
wherein at least one of the first light emitting device or the second light emitting device includes at least a portion of a light emitting layer and at least a portion of a cathode electrode, and wherein another portion of the light emitting layer and another portion of the cathode electrode is disposed in the third trench, and the another portion of the light emitting layer and the another portion of the cathode electrode are physically disconnected from the portion of the light emitting layer and the portion of the cathode electrode.

* * * * *